United States Patent
Nagatani et al.

(10) Patent No.: US 6,596,575 B2
(45) Date of Patent: Jul. 22, 2003

(54) HIGH VOLTAGE BREAKDOWN ISOLATION SEMICONDUCTOR DEVICE AND MANUFACTURING PROCESS FOR MAKING THE DEVICE

(75) Inventors: Tatsuhiko Nagatani, Chiyoda-ku (JP); Tomohide Terashima, Chiyoda-ku (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/097,852

(22) Filed: Mar. 15, 2002

(65) Prior Publication Data

US 2002/0089028 A1 Jul. 11, 2002

Related U.S. Application Data

(62) Division of application No. 08/684,558, filed on Jul. 19, 1996, now Pat. No. 6,376,891.

(30) Foreign Application Priority Data

Dec. 30, 1995 (JP) ............................................. 7-353597

(51) Int. Cl.$^7$ ......................................... H01L 21/8238
(52) U.S. Cl. ...................................... 438/222; 438/218
(58) Field of Search ................................ 438/218, 221, 438/222, 225, 226

(56) References Cited

U.S. PATENT DOCUMENTS

| | | | |
|---|---|---|---|
| 4,292,642 A | 9/1981 | Appels et al. | |
| 4,422,089 A | 12/1983 | Vaes et al. | |
| 4,589,004 A | 5/1986 | Yasuda et al. | |
| 5,023,193 A | * 6/1991 | Manoliu et al. ............ | 438/207 |
| 5,156,989 A | 10/1992 | Williams et al. | |
| 5,495,124 A | 2/1996 | Terashima | |
| 5,602,417 A | 2/1997 | Villa | |

FOREIGN PATENT DOCUMENTS

| | | |
|---|---|---|
| EP | 0 420 672 | 4/1991 |
| JP | 60-167460 | 8/1985 |
| JP | 61-58263 | 3/1986 |
| JP | 7-74264 | 3/1995 |

OTHER PUBLICATIONS

Wolf, S.; Silicon Processing for the VLSI Era vol. 2: Process Integration, Sunset Beach, CA, 1990, p.p. 28–35.*
Patent Abstracts of Japan, JP 2–139961, May 29, 1990.
Wolf, et al., Lattice Press, vol. 1, pp. 136–139, "Silicon Processing for the VLSI Era", 1986.

* cited by examiner

*Primary Examiner*—John F. Niebling
*Assistant Examiner*—Christopher Lattin
(74) *Attorney, Agent, or Firm*—Oblon, Spivak, McClelland, Maier & Neustadt, P.C.

(57) ABSTRACT

In a high breakdown voltage semiconductor device, a buried diffusion region is formed on a semiconductor substrate and an epitaxial layer is formed on the buried diffusion region and the substrate. The epitaxial layer includes a low breakdown voltage element region adjoined by a high breakdown voltage isolation region. A method for forming the high breakdown voltage isolation region complies with a Resurf condition by adjusting a thickness and an impurity concentration of the epitaxial layer.

Thus, a high breakdown voltage semiconductor device and a manufacturing process therefor is provided, which includes a low breakdown voltage element region and a high breakdown voltage element region, and a high breakdown isolation region separates a high breakdown voltage region without impairing the characteristics of an element formed on the low breakdown voltage element region.

12 Claims, 13 Drawing Sheets

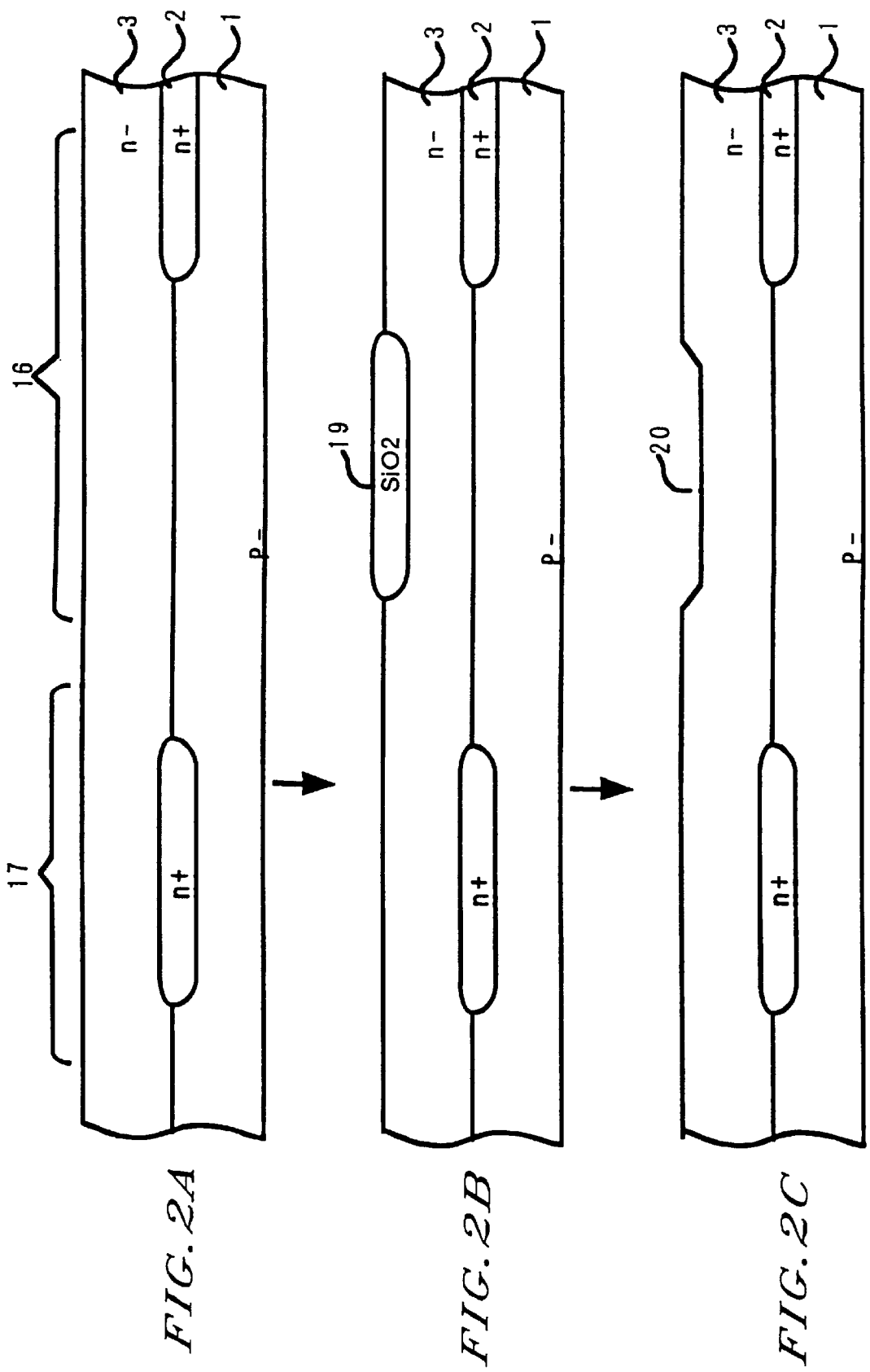

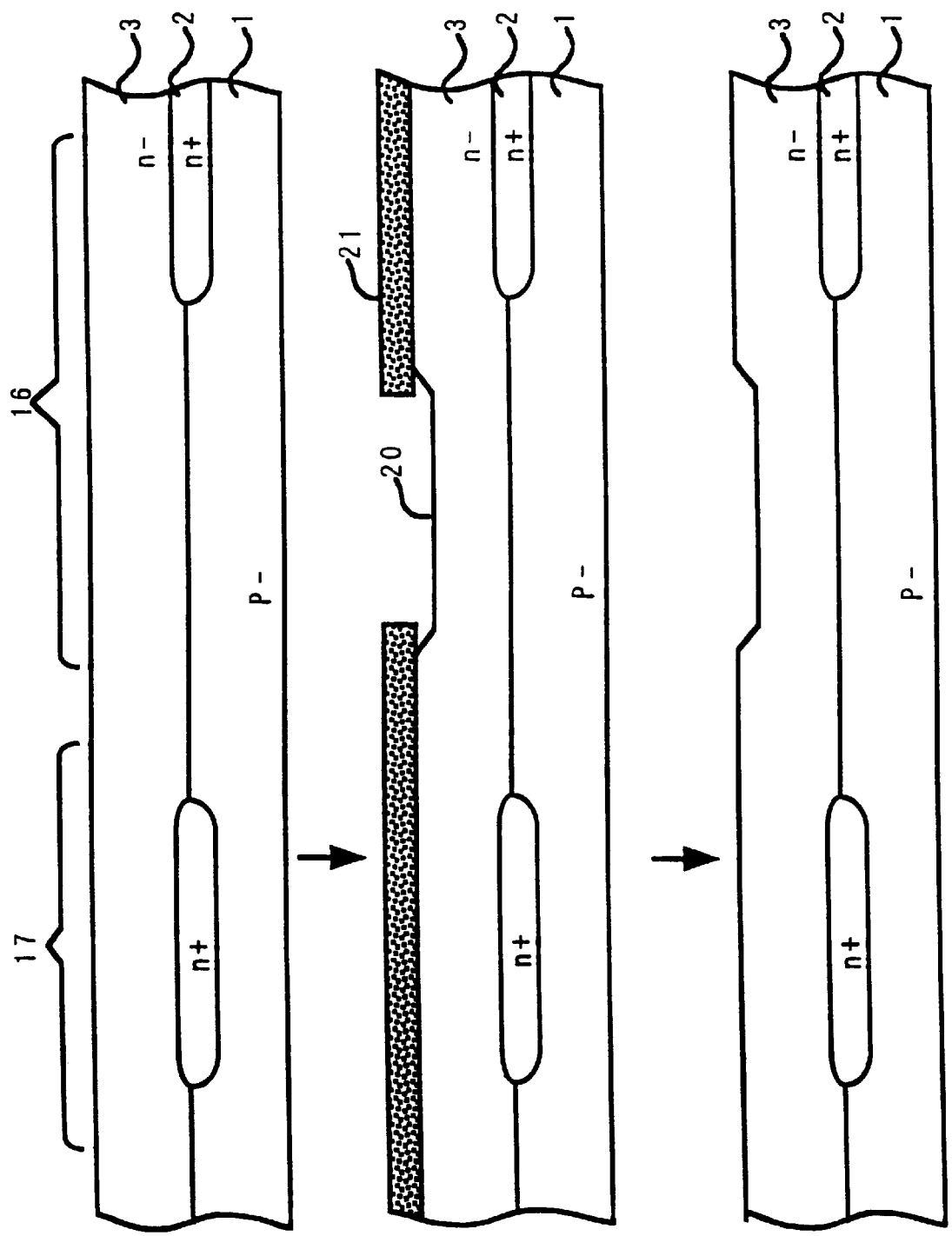

HIGH VOLTAGE BREAKDOWN ISOLATION SEMICONDUCTOR DEVICE AND MANUFACTURING PROCESS FOR MAKING THE DEVICE

CROSS-REFERENCE TO RELATED APPLICATIONS

This application is a divisional application of, and claims priority to, Ser. No. 08/684,558 filed Jul. 19, 1999 now U.S. Pat. No. 6,376,891 and claims priority to Japanese Application No. JP Hei 7-353597 filed Dec. 30, 1995. The entire contents of the parent application and the Japanese application are incorporated herein by reference.

BACKGROUND OF THE INVENTION

1. Field of the Invention

The present invention relates to a high breakdown voltage semiconductor device, and more particularly, to a semiconductor device having an isolation region of high breakdown voltage to separate a low breakdown voltage element region, and relates to a manufacturing process thereof. The present invention is particularly useful for a semiconductor device which enhances the breakdown voltage of the isolation region without impairing the characteristics of the elements in the low breakdown element region.

2. Description of the Prior Art

FIG. 12 shows a sectional view of a conventional semiconductor device including a high breakdown voltage isolation region 16 and the low breakdown voltage element region 17. The conventional semiconductor device comprises a P− semiconductor substrate 1, an n+ buried diffusion region 2, an n− epitaxial layer 3, a P− diffusion region 4, a p+ diffusion region 5, an n+ diffusion region 6, a p+ diffusion region 7, an n+ diffusion region 8, a polysilicon electrode 9, an electrode 10 and a silicon oxide film 11. The n− epitaxial layer 3 is formed to have a higher impurity concentration than the P− substrate 1, and the P− diffusion region 4 is formed to have a higher impurity concentration than the n− epitaxial layer 3. Further, the P+ diffusion region 5 is formed to reach the substrate 1.

The high breakdown voltage isolation region 16 functions to isolate a high voltage from a high-voltage region, typically located to the right of region 16 (not shown in FIG. 12). However, high breakdown voltage elements sometimes may be integrally formed in the isolation region 16. The low breakdown voltage element region 17 is integrally formed with low breakdown voltage elements 18. Typically, the low breakdown voltage elements 18 include complementary metal oxide semiconductor (CMOS, shown in FIG. 12) and bipolar (BIP) elements, while high breakdown voltage elements in the isolation region 16 include elements utilizing a "Resurf" technology, (e.g., U.S. Pat. No. 4,292,642).

A problem with the above-described conventional configuration lies in that, when the resurf technology is employed to obtain high breakdown voltage, the product of thickness of the epitaxial layer 3 (unit: cm) and its impurity concentration (unit: cm$^{-3}$) must be $9.0 \times 10^{11}$ (unit: cm$^{-2}$) or less. When the high breakdown voltage isolation region 16 and the low breakdown voltage element region 17 are simultaneously formed within the range of thickness of the epitaxial layer 3 under such a restriction, the characteristics of the low breakdown voltage element 18 may be affected adversely.

FIG. 13 shows a correlation between a breakdown voltage of the high breakdown voltage isolation region 16 and of the low breakdown voltage element 18 of the conventional structure, and the thickness of the epitaxial layer 3. The abscissa (i.e., X-axis) represents the thickness of the epitaxial layer 3, and the ordinate (i.e., Y-axis) represents a magnitude of low and high breakdown voltage. As seen from FIG. 13, the thickness of the epitaxial layer 13 should be thinned to some degree to fully satisfy the characteristics of the high breakdown voltage isolation region or the high breakdown voltage element. Conversely, a second set of curves in FIG. 13 shows epitaxial layer 3 should be thickened to some degree to assure the characteristics of the low breakdown voltage element. These conflicting breakdown relationships may cause a problem in that, when the thickness of the epitaxial layer 3 is thinned to fully satisfy the characteristics of the high breakdown voltage isolation region or the high breakdown voltage element, the P− diffusion region 4, which becomes a P− back gate layer of an n-channel MOS transistor (nch MOS), will experience punch-through and thus lowering the breakdown voltage of the nch MOS. Thus, it is necessary to thicken the epitaxial layer 3 to some degree to satisfy the characteristics of the low breakdown voltage element.

Consequently, the thickness of the epitaxial layer 3 should be controlled within a very narrow range because it is necessary in the low breakdown voltage element region 17 to assure the thickness of the effective epitaxial layer 3 so not to adversely affect a characteristic of element 18, excluding the "floating up" caused by n+ buried diffusion region 2 in the high breakdown voltage isolation region 16, and to maintain sufficient thickness to exhibit the resurf effect. Thus, in the conventional semiconductor device including a high breakdown voltage isolation region and a low breakdown voltage element region, it is difficult to obtain a high breakdown voltage isolation region with sufficient breakdown voltage isolation, and concurrently not to impair the characteristics of the low breakdown voltage element 18.

SUMMARY OF THE INVENTION

Accordingly, one object of this invention is to provide a novel device and process for manufacturing the device that overcomes the above-mentioned limitation of existing devices and manufacturing processes.

It is a further object of the invention to provide a semiconductor device including a high breakdown voltage isolation region and a low breakdown voltage element region, the high breakdown voltage isolation region having sufficient high breakdown voltage isolation, but not impairing the characteristics of a low breakdown voltage element in the low breakdown voltage element region, and to provide a manufacturing process therefor.

To accomplish the foregoing and other objects, and in accordance with the purposes of the present invention, a semiconductor device is provided in which a buried diffusion region of a second conductivity type (preferably, n+ type) is formed on a part of a semiconductor substrate of a first conductivity type (preferably, P− type). An epitaxial layer of the second conductivity type (preferably, n− type) is formed in contact with the semiconductor substrate and the buried diffusion region. A high breakdown voltage isolation region is formed in the epitaxial layer and contacts the semiconductor substrate. A low breakdown voltage element region is formed on the epitaxial layer. With this configuration, a thickness of the epitaxial layer formed in contact with the semiconductor substrate is lower than where the epitaxial layer is formed in contact with the buried diffusion region.

The above invention includes, although is not limited to, the following three ways to realize the invention.

Firstly, a semiconductor device comprising a semiconductor substrate of a first conductivity type (preferably, P– type); a buried diffusion region of a second conductivity type (preferably, n+ type) formed on a part of a primary surface of the semiconductor substrate; an epitaxial layer of the second conductivity type (preferably, n– type) formed in contact with the semiconductor substrate and the buried diffusion region, a primary surface of a portion of the epitaxial layer that is in contact with the semiconductor substrate being formed with an oxide film thereon, the oxide film being then removed therefrom; a high breakdown voltage isolation region formed on the epitaxial layer from which the oxide film is removed; and a low breakdown voltage element formed on a portion of the epitaxial layer which contacts the buried diffusion region.

Secondly, a semiconductor device comprising a semiconductor substrate of a first conductivity type (preferably, P– type); a buried diffusion region of a second conductivity type (preferably, n+ type) formed on a part of a primary surface of the semiconductor substrate; an epitaxial layer of the second conductivity type (preferably, n– type) formed in contact with the semiconductor substrate and the buried diffusion region, a primary surface of the epitaxial layer where a portion of the epitaxial layer contacts the semiconductor substrate being selectively etched; a high breakdown voltage isolation region formed on the selectively etched epitaxial layer; and a low breakdown voltage element formed a portion of the epitaxial layer and which contacts the buried diffusion region.

Thirdly, a semiconductor device comprising a semiconductor substrate of a first conductivity type (preferably, P– type); a buried diffusion region of a second conductivity type (preferably, n+ type) formed on a part of a primary surface of the semiconductor substrate; an epitaxial layer of the second conductivity type (preferably, n– type) formed in contact with the semiconductor substrate and the buried diffusion region, a primary surface of the epitaxial layer being selectively etched, and formed with an oxide film thereon, the oxide film being then removed therefrom; a high breakdown voltage isolation region formed on the epitaxial layer from which the oxide film is removed; and a low breakdown voltage element formed on a portion of the epitaxial layer which contacts with the buried diffusion region.

Next, another aspect of the present invention is to provide a semiconductor device which comprises a semiconductor substrate of a first conductivity type (preferably, P– type), and a buried diffusion region of a second conductivity type (preferably, n+ type) formed on a part of a primary surface of the semiconductor substrate. An epitaxial layer of the second conductivity type (preferably, n– type) is formed in contact with the semiconductor substrate and the buried diffusion region. A high breakdown voltage isolation region is formed on a portion of the epitaxial layer that contacts the semiconductor substrate. A low breakdown voltage element region is formed on another portion of the epitaxial layer that contacts the buried diffusion region. With such a configuration, the buried diffusion region is suppressed from floating (or raising) into the epitaxial layer.

The invention also includes another four realizations. Firstly, a semiconductor device comprising a semiconductor substrate of a first conductivity type (preferably, P– type); a buried diffusion region of a second conductivity type (preferably, n+ type) formed on a part of a primary surface of the semiconductor substrate; a non-doped epitaxial layer formed in contact with the semiconductor substrate and the buried diffusion layer; a doped epitaxial layer of the second conductivity type (preferably, n– type) formed in contact with the non-doped epitaxial layer; a high breakdown voltage isolation region formed on the doped epitaxial layer continuing from a portion of the non-doped epitaxial layer that contacts the semiconductor substrate; and a low breakdown voltage element formed on a primary surface of the doped epitaxial layer continuing from a portion of the non-doped epitaxial layer that contacts the buried diffusion region.

In this realization, the impurity concentration of the non-doped epitaxial layer is preferably one fifth or less of that of the doped epitaxial layer of the second conductivity type (preferably, n– type).

Secondly, a semiconductor device comprising a semiconductor substrate of a first conductivity type (preferably, P– type); a buried diffusion region of a second conductivity type (preferably, n+ type) formed on a part of a primary surface of the semiconductor substrate; an epitaxial layer of the first conductivity type (preferably, P– type) formed in contact with the semiconductor substrate and the buried diffusion layer; an epitaxial layer of the second conductivity type (preferably, n– type) formed in contact with the epitaxial layer of the first conductivity type; a high breakdown voltage isolation region formed on the epitaxial layer of the second conductivity type continuing from a portion of the epitaxial layer of the first conductivity type that contacts the semiconductor substrate; and a low breakdown voltage element formed on a primary surface of the epitaxial layer of the second conductivity type continuing from a portion of the epitaxial layer of the first conductivity type that contacts the buried diffusion region.

Thirdly, a semiconductor device comprising a semiconductor substrate of a first conductivity type (preferably, P– type) with a primary surface into which impurities of the first conductivity type are implanted; a buried diffusion region of a second conductivity type (preferably, n+ type) formed on a part of the primary surface of the semiconductor substrate, impurities of the first conductivity type being implanted into the primary surface of the buried diffusion region; an epitaxial layer of the second conductivity type formed on the primary surface of the semiconductor substrate implanted with the impurities of the first conductivity type (preferably, P– type) and on the buried diffusion region; a high breakdown voltage isolation region formed on the primary surface of a portion of the epitaxial layer that contacts the semiconductor substrate; and a low breakdown voltage element formed on the primary surface of a portion of the epitaxial layer that contacts the buried diffusion region.

In this realization, an impurity concentration of the epitaxial layer of the second conductivity type is preferably ten times or less than ten times of that of the semiconductor substrate.

Fourthly, a semiconductor device comprising a semiconductor substrate of a first conductivity type (preferably, P– type); a buried diffusion region of a second conductivity type (preferably, n+ type) formed by implanting impurities of the second conductivity type into a part of a primary surface of the semiconductor substrate; an epitaxial layer of the second conductivity type (preferably, n– type) formed on the semiconductor substrate and the primary surface of the buried diffusion region; a high breakdown voltage isolation region formed on a portion of the epitaxial layer that contacts the semiconductor substrate; and a low breakdown voltage element formed on the primary surface of a portion of the epitaxial layer that contacts the buried diffusion region.

Next, a semiconductor device according to another aspect of the present invention comprises a semiconductor substrate of a first conductivity type (preferably, P– type), and a buried diffusion region of a second conductivity type (preferably, n+ type) formed on a part of a primary surface of the semiconductor substrate. An epitaxial layer of the second conductivity type (preferably, n– type) is formed in contact with the semiconductor substrate and the buried diffusion region. A high breakdown voltage isolation region is formed in a portion of the epitaxial layer that contacts the semiconductor substrate. An impurity diffusion region of the second conductivity type (preferably, n– type) is formed on a primary surface of the epitaxial layer that contacts the buried diffusion region. A low breakdown voltage element is formed on a primary surface of the impurity diffusion region.

A semiconductor device according to yet another aspect of the present invention comprises a semiconductor substrate of a first conductivity type (preferably, P– type), and a first buried diffusion region of a second conductivity type (preferably, n+ type) formed on a first part of a primary surface of the semiconductor substrate. A second buried diffusion region of the second conductivity type (preferably, n– type) is formed on a second part of the primary surface of the semiconductor substrate and has an impurity concentration lower than that of the first buried diffusion region. An epitaxial layer of the second conductivity type (preferably, n– type) is formed in contact with the semiconductor substrate, the first buried diffusion region and the second buried diffusion region. A high breakdown voltage isolation region is formed on a portion of the epitaxial layer that contacts the semiconductor substrate and the first buried diffusion region. A low breakdown voltage element is formed on a portion of a primary surface of the epitaxial layer that contacts the second buried diffusion region.

The semiconductor device according to still another aspect of the present invention comprises a semiconductor substrate of a first conductivity type (preferably, P– type), and a first buried diffusion region of a second conductivity type (preferably, n+ type) formed on a part of the primary surface of the semiconductor substrate. A second buried diffusion region of the second conductivity type (preferably, n– type) is formed on a part of the primary surface of the semiconductor substrate and has an impurity concentration lower than that of the first buried diffusion region. An epitaxial layer of the second conductivity type (preferably, n– type) is formed in contact with the semiconductor substrate, the first buried diffusion region and the second buried diffusion region. A high breakdown voltage isolation region is formed on a portion of the epitaxial layer that contacts the semiconductor substrate and the first buried diffusion region. An impurity diffusion region of the second conductivity type (preferably, n– type) is formed on a portion of a primary surface of the epitaxial layer that contacts the second buried diffusion region. A low breakdown voltage element is formed on a primary surface of the impurity diffusion region.

According to an additional aspect of the present invention, a multiplicative product of a thickness of an epitaxial layer, of a semiconductor device forming the high breakdown voltage isolation region and a concentration of the epitaxial layer impurity concentration (unit: $cm^{-3}$) is $9.0 \times 10^{11}$ (unit: $cm^{-2}$) or less.

A manufacturing process for a semiconductor device according to one aspect of the present invention includes the steps of forming a buried diffusion region of a second conductivity type (preferably, n+ type) on a part of the primary surface of a semiconductor substrate of a first conductivity type (preferably, P– type). An epitaxial layer of the second conductivity type (preferably, n– type) is formed in contact with the semiconductor substrate and the buried diffusion region, and an oxide film is formed selectively on a portion of a primary surface of a portion of the epitaxial layer that contacts the semiconductor substrate, and then the oxide is removed therefrom. A high breakdown voltage isolation region is formed in the epitaxial layer in a portion that contacts the semiconductor substrate and from which the oxide film is removed. A low breakdown voltage element is formed on the primary surface of the epitaxial layer in a portion of the layer that contacts the buried diffusion region.

A manufacturing process for a semiconductor device according to another aspect of the present invention includes the steps of forming a buried diffusion region of a second conductivity type (preferably, n+ type) on a part of a primary surface of a semiconductor substrate of a first conductivity type (preferably, P– type). An epitaxial layer of the second conductivity type (preferably, n– type) is formed in contact with the semiconductor substrate and the buried diffusion region, and a primary surface of the epitaxial layer in a portion of the layer that is in contact with the semiconductor substrate is selectively etched. A high breakdown voltage isolation region is formed in the epitaxial layer which is in contact with the semiconductor substrate and which is selectively etched. A low breakdown voltage element is formed on the primary surface of the epitaxial layer in a portion of the layer that contacts the buried diffusion region.

A manufacturing process for a semiconductor device according to another aspect of the present invention includes the steps of forming a buried diffusion region of a second conductivity type (preferably, n+ type) on a part of a primary surface of a semiconductor substrate of a first conductivity type (preferably, P– type). An epitaxial layer of the second conductivity type (preferably, n– type) is formed in contact with the semiconductor substrate and the buried diffusion region, and a primary surface of a portion the epitaxial layer in contact with the semiconductor substrate is selectively etched. An oxide film is formed selectively on the primary surface of a portion of the epitaxial layer that contacts the semiconductor substrate and then the film is removed. A high breakdown voltage isolation region is formed in the epitaxial layer in the portion which contacts the semiconductor substrate and from which the oxide film is removed. A low breakdown voltage element is formed on the primary surface of a portion of the epitaxial layer in contact with the buried diffusion region.

A manufacturing process for a semiconductor device according to another aspect of the present invention includes the steps of forming a buried diffusion region of a second conductivity type (preferably, n+ type) on a part of a primary surface of a semiconductor substrate of a first conductivity type (preferably, P– type). A non-doped epitaxial layer is formed in contact with the semiconductor substrate and the buried diffusion region. An epitaxial layer of the second conductivity type (preferably, n– type) is formed in contact with the non-doped epitaxial layer. A high breakdown voltage region is formed in the epitaxial layer of the second conductivity type continuing from the non-doped epitaxial layer in a portion that contacts the semiconductor substrate. A low breakdown voltage element is formed on the primary surface of the epitaxial layer of the second conductivity type continuing from the non-doped epitaxial layer in a portion that contacts the buried diffusion region. Preferably, the impurity concentration of the non-doped epitaxial layer is one fifth, or less, than that of the epitaxial layer of the second conductivity type (preferably, n– type).

A manufacturing process for a semiconductor device according to another aspect of the present invention includes the steps of forming a buried diffusion region of a second conductivity type (preferably, n+ type) on a part of a primary surface of a semiconductor substrate of a first conductivity type (preferably, P– type). An epitaxial layer of a first conductivity type (preferably, P– type) is formed in contact with the semiconductor substrate and the buried diffusion region. An epitaxial layer of the second conductivity type (preferably, n type) is formed in contact with the epitaxial layer of the first conductivity type. A high breakdown voltage isolation region is formed in the epitaxial layer of the second conductivity type continuing from the epitaxial layer of the first conductivity type in a portion that contacts with the semiconductor substrate, and a low breakdown voltage element is formed on a primary surface of the epitaxial layer of the second conductivity type (preferably, n– type) continuing from the epitaxial layer of the first conductivity type in a portion that contacts with the buried diffusion region.

A manufacturing process for a semiconductor device according to another aspect of the present invention includes the steps of forming a buried diffusion region of a second conductivity type (preferably, n+ type) on a part of a primary surface of a semiconductor substrate of a first conductivity type (preferably, P– type), and implanting impurities of the first conductivity type (preferably, P type) into a primary surface of the semiconductor substrate and a primary surface of the buried diffusion region. An epitaxial layer of the second conductivity type (preferably, n type) is formed on the primary surfaces of the semiconductor substrate and the buried diffusion region into which impurities of the first conductivity type (preferably, p type) are implanted. A high breakdown voltage isolation region is formed in a portion of the epitaxial layer that contacts with the semiconductor substrate. A low breakdown voltage element is formed on the primary surface of the epitaxial layer in a portion that contacts the buried diffusion region.

Preferably, an impurity concentration of the epitaxial layer of the second conductivity type is ten times, or less, than that of the semiconductor substrate of the first conductivity type (preferably, P– type).

A manufacturing process for a semiconductor device according to another aspect of the present invention comprises the steps of forming a buried diffusion region of a second conductivity type (preferably, n+ type) by implanting impurities of the second conductivity type into a part of a primary surface of a semiconductor substrate of a first conductivity type (preferably, P– type). An epitaxial layer of the second conductivity type (preferably, n– type) is formed on a primary surface of the semiconductor substrate and a primary surface of the buried diffusion region. A high breakdown voltage isolation region is formed in the epitaxial layer in a portion that contacts the semiconductor substrate, and a low breakdown voltage element is formed on the primary surface of the epitaxial layer in a portion that contacts the buried diffusion region.

A manufacturing process for a semiconductor device according to another aspect of the present invention includes the steps of forming a buried diffusion region of a second conductivity type (preferably, n+ type) on a part of a primary surface of a semiconductor substrate of a first conductivity type (preferably, P– type). An epitaxial layer of the second conductivity type (preferably, n– type) is formed in contact with the semiconductor substrate and the buried diffusion region. A high breakdown voltage isolation region is formed in the epitaxial layer in a portion that contacts the semiconductor substrate. An impurity diffusion region of the second conductivity type (preferably, n type) is formed on a primary surface of the epitaxial layer in a portion that continues from the buried diffusion region, and a low breakdown voltage element is formed on the impurity diffusion region.

A manufacturing process for a semiconductor device according to another aspect of the present invention includes the steps of forming a first buried diffusion region of a second conductivity type (preferably, n– type) on a part of a primary surface of a semiconductor substrate of a first conductivity type (preferably, P– type). A second buried diffusion region of the second conductivity type (preferably, n– type) has an impurity concentration lower than the first buried diffusion region and is formed on a part of the primary surface of the semiconductor substrate. An epitaxial layer of the second conductivity type is formed in contact with the semiconductor substrate, the first buried diffusion region and the second buried diffusion region. A high breakdown voltage isolation region is formed in a portion of the epitaxial layer contacting with the semiconductor substrate and the one buried diffusion region, and a low breakdown voltage element is formed on a primary surface of a portion of the epitaxial layer contacting with the buried diffusion region.

A manufacturing process for a semiconductor device according to another aspect of the present invention comprises the steps of forming a first buried diffusion region of a second conductivity type (preferably, n– type) on a part of a primary surface of a semiconductor substrate of a first conductivity type (preferably, P– type). A second buried diffusion region of the second conductivity type having an impurity concentration lower than the first buried diffusion region and is formed on a part of a primary surface of the semiconductor substrate. An epitaxial layer of the second conductivity type is formed in contact with the semiconductor substrate, the first buried diffusion region and the second buried diffusion region. A high breakdown voltage isolation region is formed in the epitaxial layer in a portion that contacts the semiconductor substrate and the first buried diffusion region. An impurity diffusion region of the second conductivity type is formed on a primary surface of a portion of the epitaxial layer contacting with the another buried diffusion region, and a low breakdown voltage element is formed on the impurity diffusion region.

Furthermore, according to another aspect of the manufacturing processes of the present invention, a multiplicative product of a thickness (unit: cm) of a portion of epitaxial layer forming the high breakdown voltage isolation region and a concentration of the portion of the epitaxial layer impurity concentration (unit: $cm^{-3}$) is $9.0 \times 10^{11}$ (unit: $cm^{-2}$) or less.

Other objects, features and advantages of the invention will appear more fully from the following description.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 2(a) through 2(c) illustrate a manufacturing process of a semiconductor device according to a second embodiment of the present invention.

FIGS. 3(a) through 3(c) illustrate a manufacturing process of a semiconductor device according to a third embodiment of the present invention.

DETAILED DESCRIPTION OF THE PREFERRED EMBODIMENTS

Figure 1:
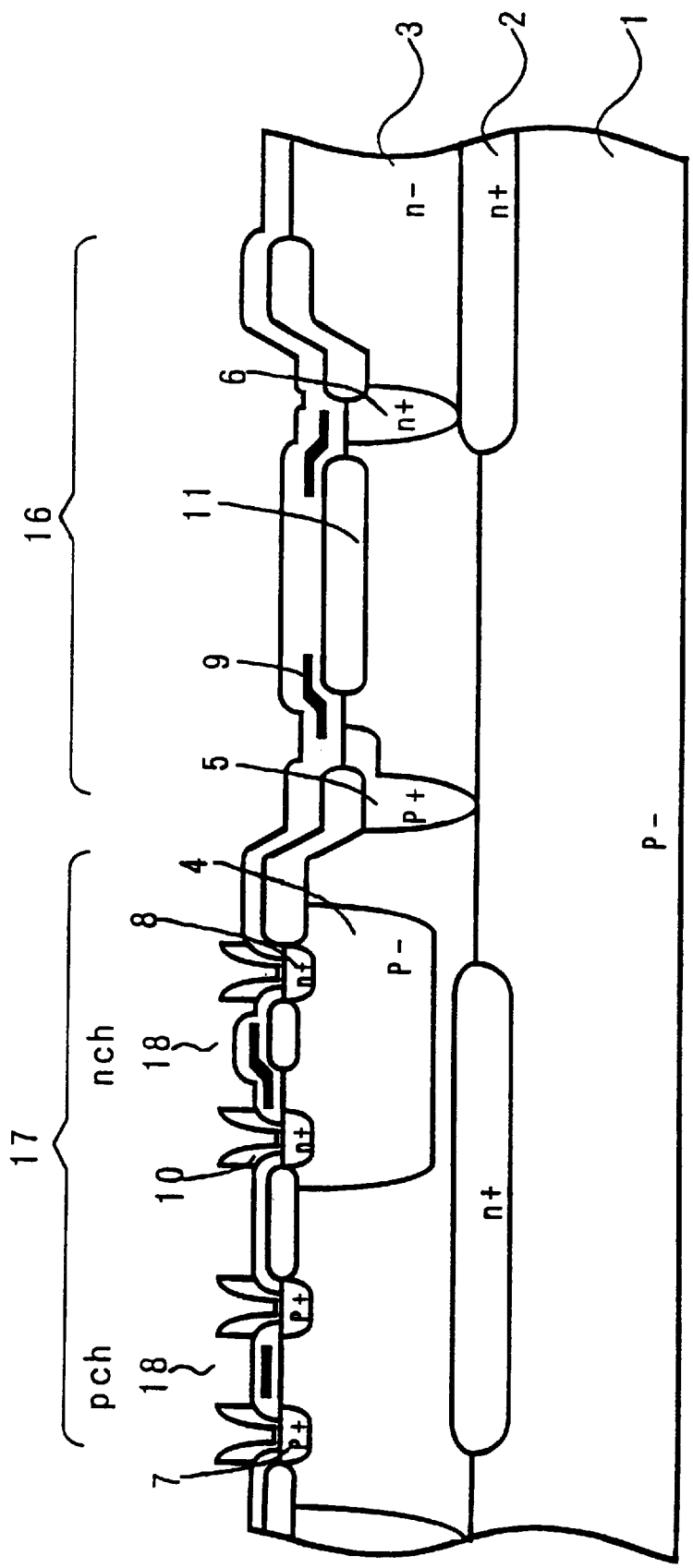
FIG. 1 shows a sectional view of a semiconductor device according to a first embodiment of the present invention.

This invention will be described in further detail by way of example with reference to the accompanying drawings, wherein like reference numerals designate identical or corresponding parts throughout the views, and more particularly FIG. 1 shows a semiconductor device according to the first embodiment of the present invention.

First Embodiment

As shown in FIG. 1, the semiconductor device of this embodiment comprises a semiconductor substrate 1 of a first conductivity type (preferably, P− type) (hereinafter called "P− substrate 1"), a buried diffusion region 2 of a second conductivity type (preferably, n+ type) (hereinafter called "n+ buried diffusion region 2"), an epitaxial layer 3 of the second conductivity type (preferably, n− type) (hereinafter called "n-epitaxial layer 3"), a diffusion region 4 of the first conductivity type (hereinafter called "P− diffusion region 4"), a diffusion region 5 of the first conductivity type (preferably, p+ type) (hereinafter called "p+ diffusion region 5"), a diffusion region 6 of the second conductivity type (hereinafter called an "n+ diffusion region 6"), a diffusion region 7 of the first conductivity type (preferably, p+ type) (hereinafter called a "p+ diffusion region 7"), a diffusion region 8 of the second conductivity type (hereinafter called "n+ diffusion region 8"), a polysilicon electrode 9, an electrode 10 (e.g., a gate electrode), and a field oxide film 11 (silicon oxide film). The n− epitaxial layer 3 has an impurity concentration higher than that of the P− substrate 1, and the P− diffusion region 4 has an impurity concentration higher than that of the n− epitaxial layer 3. The p+ diffusion region 5 is formed to reach the P− substrate 1.

The semiconductor device comprises a high breakdown voltage isolation region 16, and a low breakdown voltage element region 17. The high breakdown voltage isolation region 16 functions to isolate a high voltage from a high-voltage region (not shown in FIG. 1, but would be located to the right of region 16 in FIG. 1). However, high breakdown voltage isolation elements sometimes may be integrally formed in the isolation region 16. For example, when a source region is formed under a primary surface of the p+ diffusion region 5, the polysilicon electrode 9 is used as a gate electrode. In addition, at least one low breakdown voltage element 18 is formed on the low breakdown voltage element region 17.

The semiconductor device of this embodiment is constructed so that the n− epitaxial layer 3 in the high breakdown voltage isolation region 16 is thinned to a thickness to exhibit a Resurf effect, while the n− epitaxial layer 3 in the low breakdown voltage element region 17 is thickened to a thickness required to enhance the characteristics of the low breakdown voltage element 18.

With such structure, the n− epitaxial layer 3 in the low breakdown voltage element region 17 assuredly preserves a sufficient thickness for the epitaxial layer 3 even if the n+ buried diffusion region 2 floats (raises) up into the epitaxial layer 3. In the high breakdown voltage isolation region 16, the n− epitaxial layer 3 can be controlled to an appropriate thickness by satisfying the Resurf condition represented by equation (1) set forth below. That is, the multiplicative product of the thickness of the n− epitaxial layer 3 forming the high breakdown voltage isolation region 16 (unit: cm) and an impurity concentration of region 16 (unit: cm$^{-3}$) is made $9.0 \times 10^{11}$ (unit: cm$^{-2}$) or less.

$$N \times t1 \leq 9.0 \times 10^{11} \text{ cm}^{-2} \qquad \text{(equation 1)}$$

where,

N: Impurity concentration of the epitaxial layer 3 of the second conductivity type (unit: cm$^{-3}$)

t1: Thickness of the epitaxial layer 3 of the second conductivity type (unit: cm).

As a specific example, the epitaxial layer 3 has the impurity concentration of $1 \times 10^{13}$ to $1 \times 10^{17}$, and is grown to a thickness of 3–20 μm. In the high breakdown voltage isolation region 16, the thickness is thinned by about 0.5–5 μm relative to the 3–20 μm range to create a new range of 0.5–19.5 μm, so as to satisfy equation (1).

With such arrangement, the epitaxial layer 3 may have different thicknesses in the low breakdown voltage element region 17 and the high breakdown voltage isolation region 16 in order to provide optimum respective conditions. In addition, the controlled thickness range of the epitaxial layer 3 can be widened. Accordingly, it is possible to provide a high breakdown voltage isolation region 16 capable of attaining sufficient breakdown voltage isolation without impairing the characteristics of a low breakdown voltage element.

Typically, the low breakdown voltage element 18 includes CMOS or BIP (npn transistor and Lpnp transistor) elements, while the high breakdown voltage elements employ the Resurf technology. More specifically, the low breakdown voltage elements also include 3–40 V type CMOS (NMOS transistor and PMOS transistor) elements and 3–40 V type Bip elements, and the high breakdown voltage element includes 50–1200 V type DMOS elements and 50–1200 V type IGBT elements.

Operationally, the low breakdown voltage element 18 is often used for processing analog and digital signals, that is, while the high breakdown voltage element 18 is often used in an output stage that requires a high breakdown voltage.

Input/output information is processed by the low breakdown voltage element 18, and is ultimately output by the high breakdown voltage element to control operation of a load. Since a usual control integrated circuit (IC) cannot provide necessary and sufficient output for driving a load, a high breakdown voltage element (DMOS, IGBT) or the like is employed for typical applications like automobile ICs, industrial IC, and display tube ICs.

Second Embodiment

FIGS. 2(*a*) through 2(*c*) show an example manufacturing process for manufacturing a semiconductor device having a structure of the first embodiment, shown in FIG. 1. Initially, as shown in FIG. 2(*a*), formed on the P− substrate 1 is the n+ buried diffusion region 2 on which the n− epitaxial layer 3 is grown. The n− epitaxial layer 3 is formed to have an impurity concentration higher than that of the P− substrate 1. Then, as shown in FIG. 2(*b*), the high breakdown voltage isolation region 16 is thickly oxidized with selective oxidation to form the silicon oxide film 19. Subsequently, as shown in FIG. 2(*c*), the oxide film 19 is removed with hydrofluoric acid or the like to form a recess 20, and to lower the primary surface of the n− epitaxial layer 3 so that region 16 has a different epitaxial layer 3 thickness than the low breakdown voltage element region 17. Thus, in the low breakdown voltage element region 17, the epitaxial layer 3 is sufficiently thick even through the n+ buried diffusion region 2 may float (or raise) up a portion of the epitaxial layer 3. In the high breakdown voltage isolation region 16, the epitaxial layer 3 is controlled such that its thickness is sufficient to exhibit the Resurf effect.

As a specific example of the semiconductor device, the n− epitaxial layer 3 has the impurity concentration of $1\times10^{13}$ to $1\times10^{17}$, and is grown to a thickness of 3–20 μm. The oxide film 19 has a thickness of 1–10 μm. When the oxide film 19 is removed, the epitaxial layer 3 is engraved or thinned by about 0.5–5 μm. The thickness of the epitaxial layer 3 with the oxide film 19 removed is between 0.5–19.5 μm so as to attain the requisite thickness for satisfying the Resurf condition described in the equation (1).

This manufacturing process yields a difference in thickness of the n− epitaxial layer 3 in the low breakdown voltage element region 17 and the high breakdown voltage isolation region 16 so as to attain optimal conditions for these regions respectively. In addition, the controlled thickness range can be widened for the n− epitaxial layer 3. Accordingly, it is possible to produce a high breakdown voltage isolation region 16 capable of attaining a sufficiently large breakdown voltage isolation without impairing the characteristics of the low breakdown voltage element 18. Furthermore, with such a manufacturing process, the Inventors recognize low breakdown voltage element 18 and high breakdown voltage isolation region 16 each having good characteristics can be produced using standard manufacturing processes for bipolar transistors and bipolar CMOS transistors.

Third Embodiment

FIGS. 3(*a*) through 3(*c*) show another manufacturing process for manufacturing a semiconductor device having the structure shown in FIG. 1. Initially, as shown in FIG. 3(*a*), formed on the P− substrate 1 is the n+ buried diffusion region 2 on which the n− epitaxial layer 3 is grown. The n− epitaxial layer 3 is formed to have an impurity concentration higher than that of the P− substrate 1.

Then, as shown in FIG. 3(*b*), a resist 21 is applied and an opening is made in the resist 21 in the high breakdown voltage isolation region 16 by using a photolithography process. Subsequently, the epitaxial layer 3 in the high breakdown voltage isolation region 16 is selectively etched to form a recess 20, thereby lowering the primary surface of the n− epitaxial layer 3 in region 16 so that it has a different thickness than in the low breakdown voltage element region 17. Thus, in the low breakdown voltage element region 17, the epitaxial layer 3 is thicker even when a floating-up of the n+ buried diffusion region 2 occurs. In the high breakdown voltage isolation region 16, the thickness of the epitaxial layer 3 is controlled consistent with the Resurf condition.

This manufacturing process yields a difference in thickness of the epitaxial layer 3 in the low breakdown voltage element region 17 and in the high breakdown voltage isolation region 16 so as to attain optimal conditions for these regions respectively. In addition, the controlled thickness range can be widened for the n− epitaxial layer 3. Accordingly, it is possible to produce an isolation region 16 of having a high breakdown voltage isolation capability without impairing the characteristics of the low breakdown voltage element 18. Furthermore, with such a manufacturing process, the Inventors recognize the low breakdown voltage element 18 having good characteristics and high breakdown voltage isolation region can be produced using standard manufacturing processes for bipolar transistors and bipolar CMOS transistors.

Fourth Embodiment

Figures 4A, 4B, 4C, 4D:
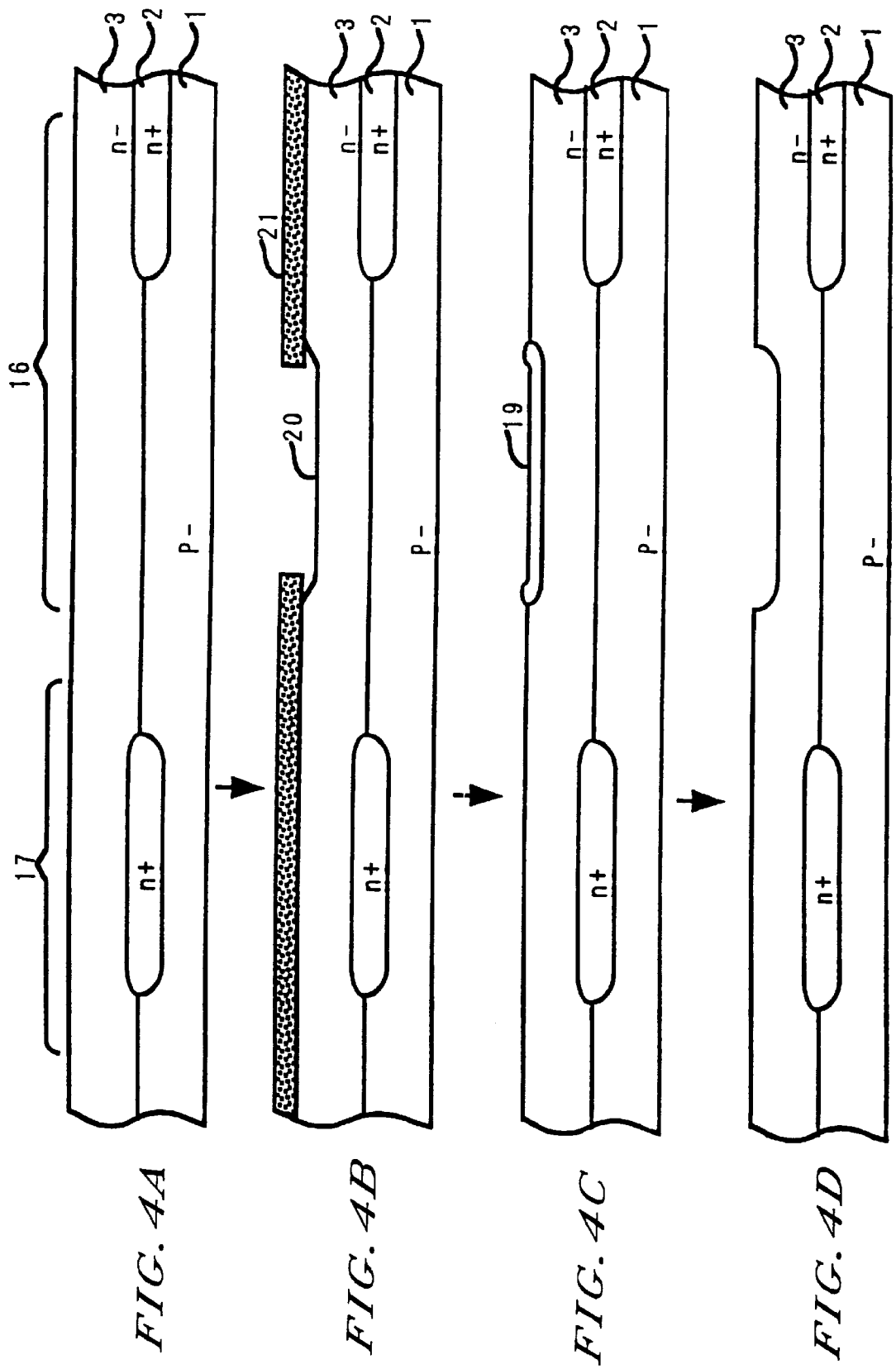
FIGS. 4(a) through 4(d) illustrate a manufacturing process of a semiconductor device according to a fourth embodiment of the present invention.

FIGS. 4(*a*) through 4(*d*) show another manufacturing process for manufacturing a semiconductor device having the structure shown in FIG. 1. The fourth embodiment is a combination of the manufacturing processes of the second and third embodiments. Initially, as shown in FIGS. 4(*a*) through 4(*b*), the n− epitaxial layer 3 is grown, and the resist 21 is deposited and selectively opened at the high breakdown voltage isolation region 16 by a photolithography process. Then, the epitaxial layer 3 in the high breakdown voltage isolation region 16 is selectively etched to form a recess 20 thereby lowering a primary surface of epitaxial layer 3 in this region.

Subsequently, as shown in FIGS. 4(*c*)–(*d*), the recess 20 in the high breakdown voltage isolation region 16 is thickly oxidized by selective oxidation to form an oxide film 19. Then, the oxide film 19 is removed by solution such as hydrofluoric acid, or HF, to further deepen the recess 20 and to further lower the primary surface so that epitaxial layer 3 has different thicknesses in region 16 and in the low breakdown voltage element region 17. Thus, in the low breakdown voltage element region 17, the thickness of the epitaxial layer 3 is sufficiently thick even though the n+ buried diffusion region 2 may float (or raise) up a portion of the epitaxial layer 3. In the high breakdown voltage isolation region 16, the epitaxial layer 3 is controlled such that its thickness is sufficient to exhibit the Resurf effect.

This manufacturing process yields a difference in thickness of the epitaxial layer 3 in the low breakdown voltage element region 17 and in the high breakdown voltage isolation region 16 so as to attain optimal conditions for these regions respectively. In addition, the controlled thickness range can be widened for the n− epitaxial layer 3. Accordingly, it is possible to produce a high breakdown voltage isolation region capable of attaining a sufficiently high voltage isolation capability without impairing the characteristics of the low breakdown voltage element 18. Furthermore, with such manufacturing process, the Inventors recognize low breakdown voltage element 18 having good characteristics and high breakdown voltage isolation regions having good characteristics can be produced using standard manufacturing processes for bipolar transistors and bipolar CMOS transistors.

Fifth Embodiment

Figure 5:
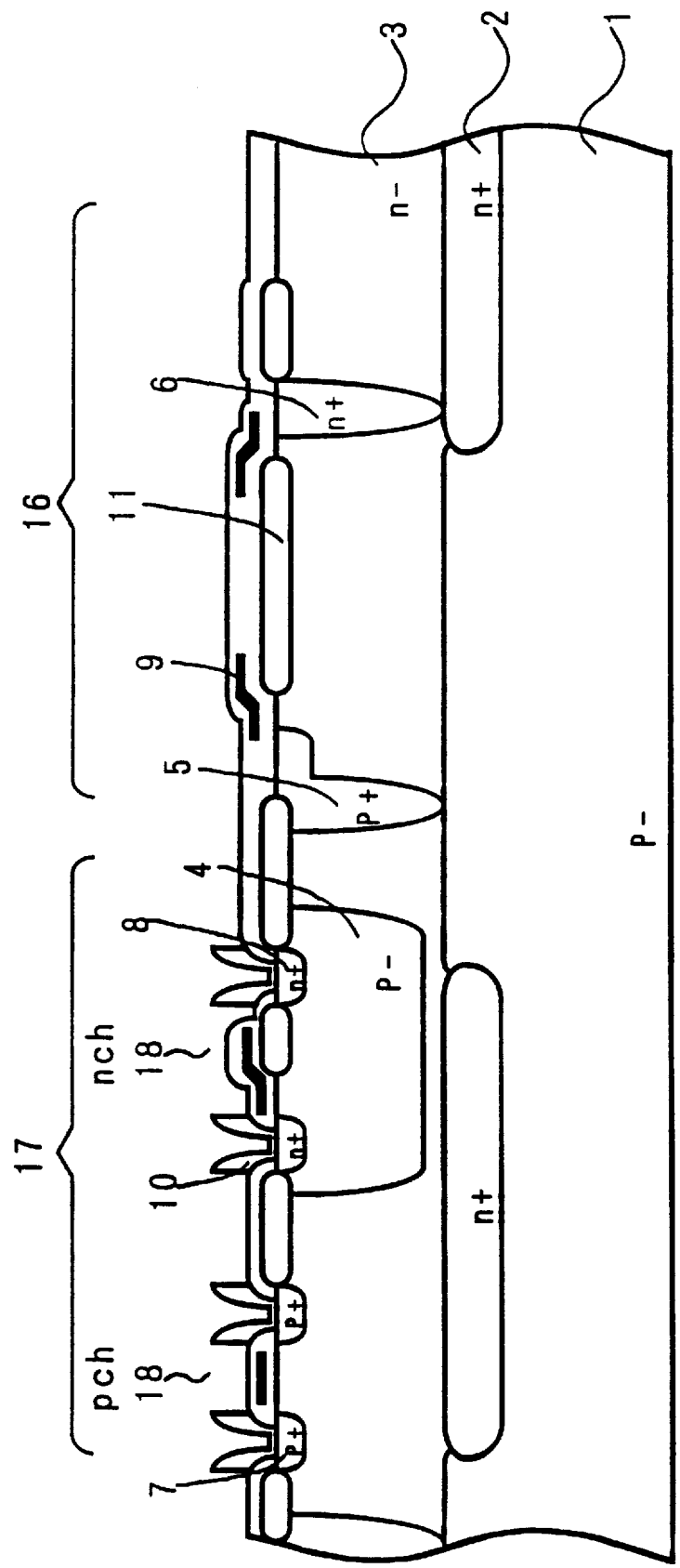
FIG. 5 shows a sectional view of a semiconductor device according to a fifth embodiment of the present invention.

FIG. 5 is a semiconductor device according to the fifth embodiment of the present invention. As shown in FIG. 5, the semiconductor device of this embodiment comprises a P− substrate 1, an n+ buried diffusion region 2, an n− epitaxial layer 3, a P− diffusion region 4, a p+ diffusion region 5, an n+ diffusion region 6, a p+ diffusion region 7, an n+ diffusion region 8, a polysilicon electrode 9, an electrode 10, and a silicon oxide film 11. The n− epitaxial layer 3 has an impurity concentration higher than that of the P− substrate 1, and the P− diffusion region 4 has an impurity concentration higher than that of the n− epitaxial layer 3. In addition, the p+ diffusion region 5 is formed to reach the P− substrate 1.

The semiconductor device comprises a high breakdown voltage isolation region 16, and a low breakdown voltage element region 17. The high breakdown voltage isolation region 16 functions to isolate a high voltage from a high-voltage region (not shown in FIG. 1, but would be to the right of region 16 in FIG. 5). However, high breakdown voltage isolation elements sometimes may be integrally formed in the isolation region 16. A low breakdown voltage element 18 is formed in the low breakdown voltage element region 17, the low breakdown voltage element 18 including CMOS and BIP elements, while the high breakdown voltage element employs the Resurf technology.

Figure 12:
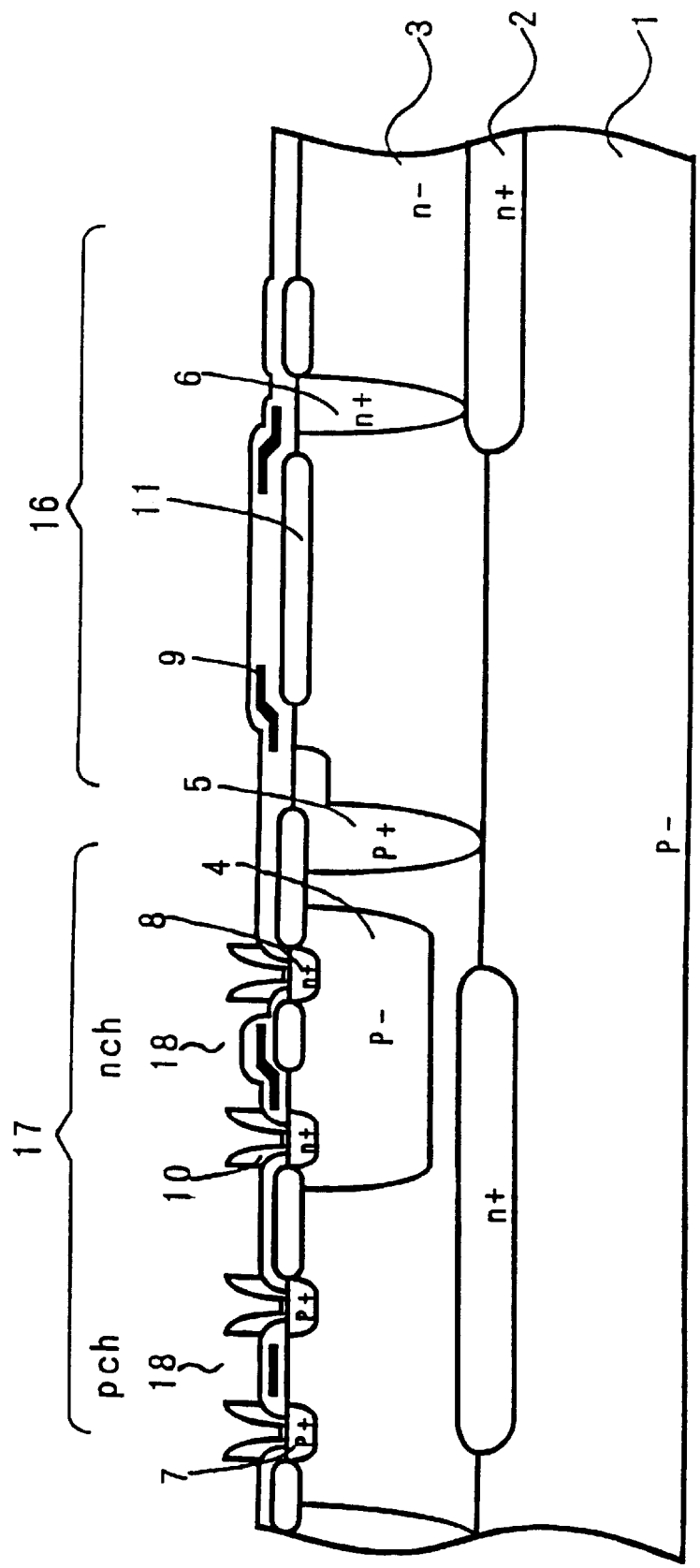
FIG. 12 shows a sectional view of a conventional semiconductor device.
Figure 13:
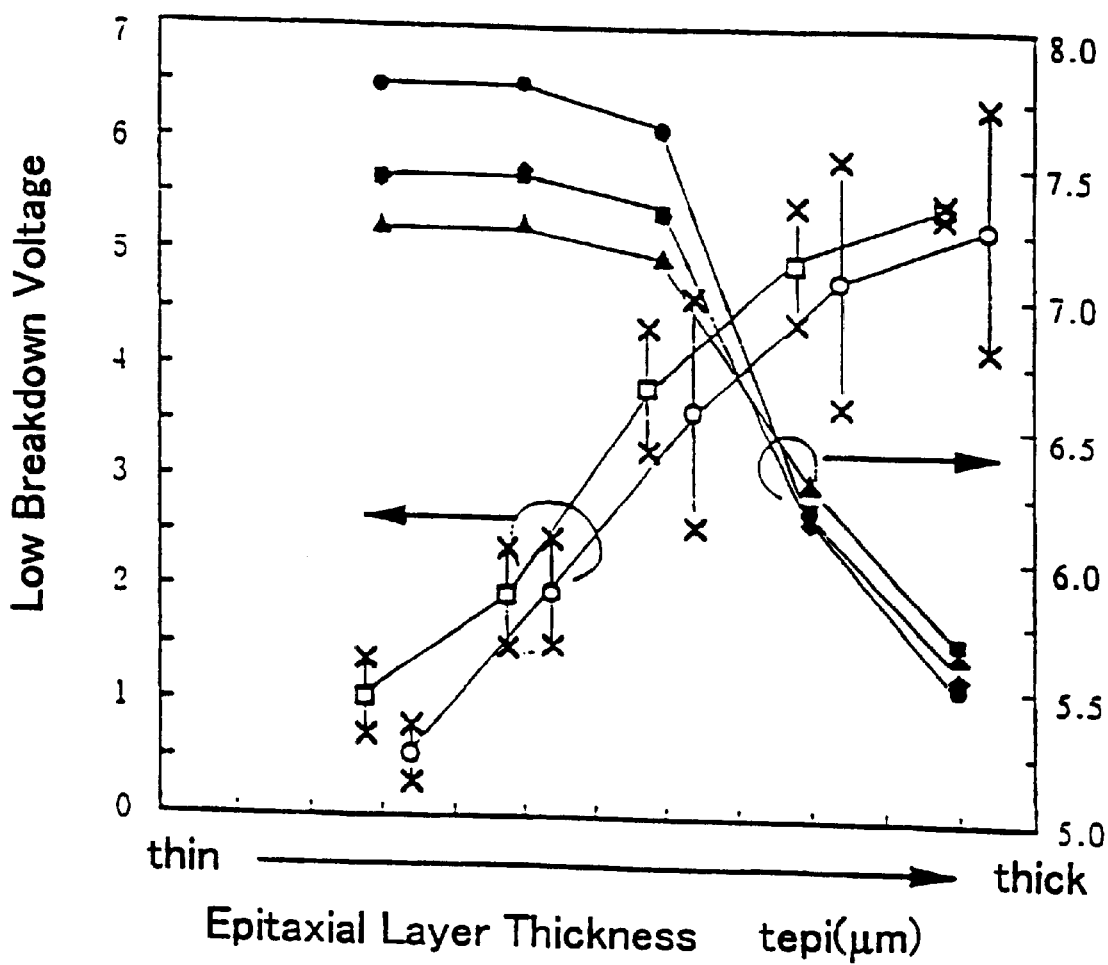
FIG. 13 shows a relationship between a thickness of an epitaxial layer and a breakdown voltage characteristic of a semiconductor device.

In this fifth embodiment, as seen from FIG. 5, the n+ buried diffusion region 2 is suppressed from floating (or raising) up into the epitaxial layer 3. In other words, diffusion region 2 is sunk down into substrate 1 in order to limit the diffusion regions intrusion into epitaxial layer 3. Thus, the top of the n+ buried diffusion region is generally co-planar with a primary surface at substrate 1. In contrast, the conventional semiconductor device shown in FIG. 12 shows the n+ buried diffusion region 2 not being suppressed from floating up to the n− epitaxial layer 3. Therefore, the thickness of the n− epitaxial layer 3 in the low breakdown voltage element region 17 can effectively be thickened in comparison to the conventional device, when the thickness of the n− epitaxial layer 3 is made equal for both devices in the high breakdown voltage isolation region 16. Moreover, if the effective thickness of the n− epitaxial layer 3 is made equal in the low breakdown voltage element region 17 for both devices, the effective thickness of the n− epitaxial layer 3 in the high breakdown voltage isolation region 16 can be reduced in this embodiment in comparison to the conventional device.

With such an arrangement, it is possible to reduce a floating up of the n+ buried diffusion region 2 into the n− epitaxial layer 3, and to provide for optimal thickness conditions for both the low breakdown voltage element region 17 and the high breakdown voltage isolation region 16. In addition, the controlled thickness range can be widened for the n− epitaxial layer 3. Accordingly, it is possible to manufacture a high breakdown voltage isolation region 16 capable of attaining sufficient breakdown voltage isolation without impairing the characteristics of the low breakdown voltage element 18.

Sixth Embodiment

FIGS. 6(a) through 6(c) shows an example of a manufacturing process for manufacturing a semiconductor device having the structure shown in FIG. 5. Initially, as shown in FIG. 6(a), formed on a P− substrate 1 is the n+ buried diffusion region 2 on which a non-doped epitaxial layer 12 is initially grown to a thickness of, for example, several micrometers. Then, as shown in FIG. 6(b), n− epitaxial growth is carried out under desired conditions to form the n− epitaxial layer 3. Through subsequent heat treatment, each region takes the topography shown in FIG. 6(c).

That is, in the low breakdown voltage element region 17, the n+ buried diffusion region 2 is suppressed from floating into the epitaxial layer 3 because the epitaxial layer 12 is non-doped, and thus, has a low impurity concentration. Because the n+ buried diffusion region 2 substantially extends through the non-doped epitaxial layer 12 to contact the epitaxial layer 3, there is no risk in bipolar elements having low breakdown voltages in the low breakdown voltage element region 17. In addition, in the case of CMOS elements, an impurity concentration other than that in a surface area of the epitaxial layer 3 does not affect characteristics of the CMOS elements.

Figure 6:
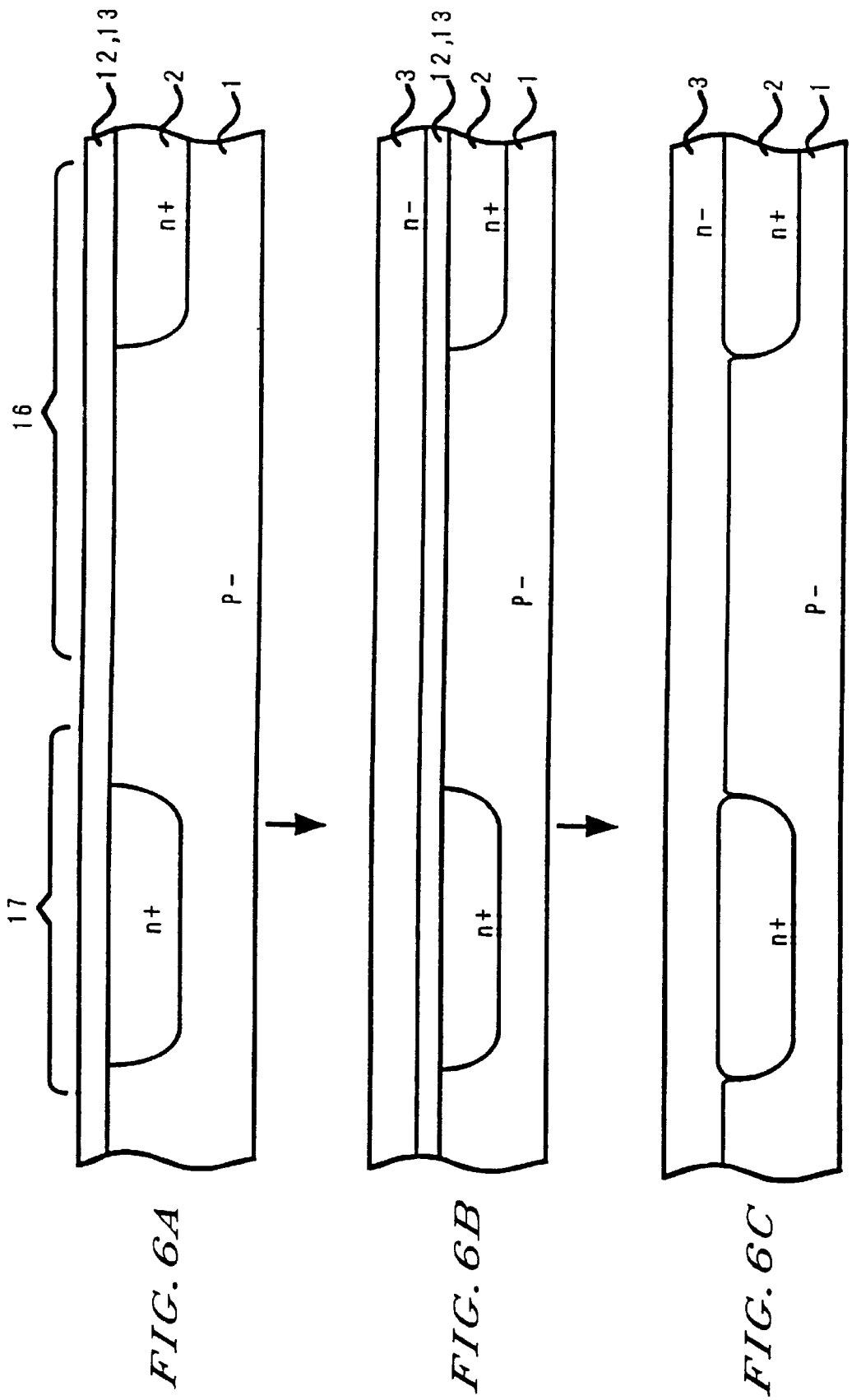
FIG. 6(a) through 6(c) illustrates a manufacturing process of a semiconductor device according to sixth and a seventh embodiment of the present invention.

On the other hand, since the epitaxial layer 12 is non-doped and has the low impurity concentration, it may be grown thinner than the conventional device, and so the thickness of the n− epitaxial layer 3 becomes thinner than the conventional device by the thickness of the non-doped epitaxial layer 12. In other words, as shown in FIG. 6, a sinking down of the n− epitaxial layer 3 is reduced in the high breakdown voltage isolation region 16 because region 2 does not impinge into the n− epitaxial layer. In addition, since the effective thickness of the epitaxial layer, as restrained by the Resurf condition, is only the thickness of the n− epitaxial layer 3. The effective thickness of the epitaxial layer 3 can be sufficiently thinned.

While, in practice, it is unavoidable for the non-doped epitaxial layer 12 to be doped to a low concentration, it is desirable that the concentration is one fifth (⅕) or less of the impurity concentration in the n− epitaxial layer 3.

As described, since the thickness of the n− epitaxial layer 3 in the low breakdown voltage element region 17 can substantially be made to be the respective stacked thickness of the epitaxial layer 3 and the epitaxial layer 12, and the thickness of the epitaxial layer 3 in the high breakdown voltage isolation region 16 is only that of the epitaxial layer 3, it is possible to easily obtain a thickness of the epitaxial layer 3 which can satisfy the characteristics of both the low breakdown voltage element 18 and the high breakdown isolation region.

With such a manufacturing process, it is possible to reduce floating up of the n+ buried diffusion region 2 into the n− epitaxial layer 3 (i.e., to reduce sinking down of the n− epitaxial layer 3) and to provide the optimal thickness conditions for both the low breakdown voltage element region 17 and the high breakdown voltage isolation region 16. In addition, the controlled thickness range can be widened for the n− epitaxial layer 3. Accordingly, it is possible to manufacture a high breakdown voltage isolation region capable of attaining a sufficiently high breakdown voltage isolation without impairing the characteristics of the low breakdown voltage element 18. Furthermore, with such a manufacturing process, the Inventors recognize low breakdown voltage element 18 having good characteristics and high breakdown voltage isolation regions having good characteristics can be manufactured using standard manufacturing processes for bipolar transistors and bipolar CMOS elements.

Seventh Embodiment

The seventh embodiment provides a manufacturing process for manufacturing a semiconductor device having the structure shown in FIG. 5. This seventh embodiment shows a process replacing the non-doped epitaxial layer 12 with a P− epitaxial layer 13 in the manufacturing process shown in FIGS. 6(a) through 6(c) for the sixth embodiment. Therefore, a figure for illustrating this manufacturing process is the same as FIGS. 6(a) through 6(c) of the sixth embodiment. As shown in FIG. 6(a), formed on a P− substrate 1 is the n+ buried diffusion region 2 on which the P− epitaxial layer 13 is initially grown to a thickness of, for example, several micrometers. Then, as shown in FIG. 6(b), n− epitaxial growth is carried out under desired conditions to form the n− epitaxial layer 3. Through subsequent heat treatment, each region takes the topography shown in FIG. 6(c). That is, since the epitaxial layer 13 is doped with P− type impurities, the n− epitaxial layer 3 sinks down to a lesser extent into the P− substrate 1 in the high breakdown voltage isolation region 16. Since the effective thickness of the n− epitaxial layer 3 under the Resurf condition is only the thickness of the n− epitaxial layer 3, the effective thickness of the n− epitaxial layer 3 becomes sufficiently thin. In addition, in the low breakdown voltage element region 17, the n+ buried diffusion region 2 is suppressed from floating up into the P− epitaxial layer 12. However, the n+ buried diffusion region 2 comes into contact with the n− epitaxial layer 3, yet there is no degrading effect on bipolar elements formed in region 17 having low breakdown voltage, nor are CMOS elements negatively affected.

As described, since the effective thickness of the n− epitaxial layer 3 in the low breakdown voltage element region 17 can substantially be made to be the respective stacked thickness of the epitaxial layer 3 and the epitaxial layer 12, yet the effective thickness of the epitaxial layer in the high breakdown voltage isolation region 16 is that of the n− epitaxial layer 3, it is possible to easily obtain a thickness of the epitaxial layer 3 which can satisfy the characteristics of both the low breakdown voltage element 18 and the high breakdown voltage element.

With such a manufacturing process, it is possible to reduce floating of the n+ buried diffusion region 2 into the n− epitaxial layer 3 (i.e., to reduce sinking down of the n− epitaxial layer 3) and to provide the optimal conditions for both the low breakdown voltage element region 17 and the high breakdown voltage isolation region 16. In addition, the controlled thickness range can be widened for the n− epitaxial layer 3. Accordingly, it is possible to produce a high breakdown voltage isolation region capable of attaining a sufficiently high breakdown voltage isolation without impairing the characteristics of the low breakdown voltage element 18. Furthermore, with such a manufacturing process, the Inventors recognize low breakdown voltage element 18 having good characteristics and high breakdown voltage isolation regions having good characteristics can be produced using the standard manufacturing process for bipolar transistors and bipolar CMOS elements.

Eighth Embodiment

Figure 7:
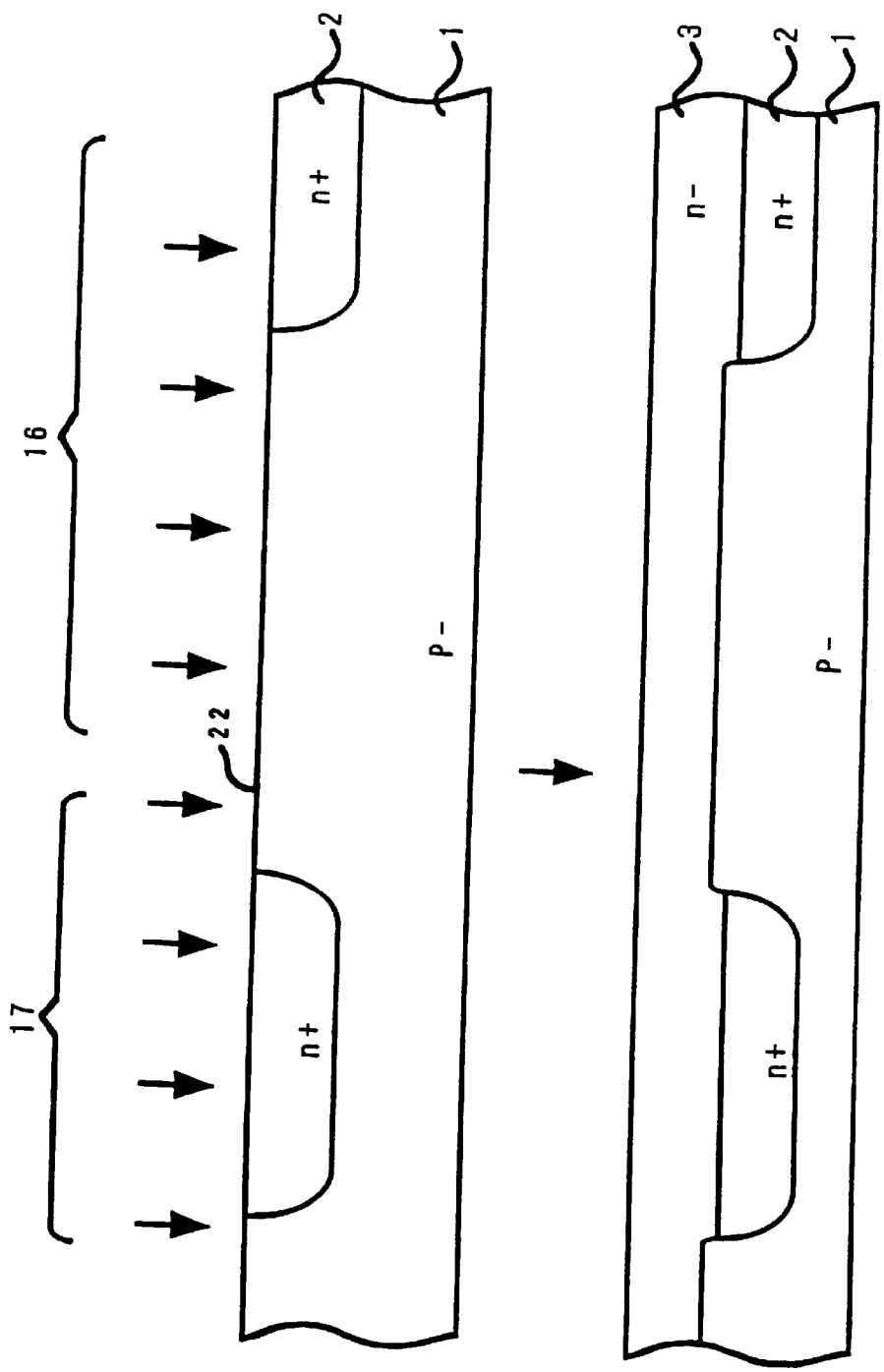
FIGS. 7(a) and 7(b) illustrate a manufacturing process of a semiconductor device according to an eighth embodiment of the present invention.

FIGS. 7(a) through 7(b) show another manufacturing process for manufacturing a semiconductor device having the structure shown in FIG. 5. First, as shown in FIG. 7(a), a n+ buried diffusion region 2 is formed on the P− substrate 1. Then, prior to epitaxial growth, P− type impurities such as boron B are implanted in an entire exposed surface of substrate 1 and region 2 to form a boron implanted layer 22. Thereafter, as shown in FIG. 7(b), an n− epitaxial layer 3 is grown. Through subsequent heat treatment, each region takes the topography shown in FIG. 7(b).

That is, in the low breakdown voltage element region 17, due to existence of the boron implanted layer 22, the n+ buried diffusion region 2 is suppressed from floating to the n− epitaxial layer 3. In the low breakdown voltage element region 17, because the n+ buried diffusion region 2 has a sufficiently high impurity concentration, the boron implantation does not affect region 2 remaining a n+ region. On the other hand, in the high breakdown voltage isolation region 16, the boron implanted layer 22 does sink down the n− epitaxial layer 3 so that the thickness of the n− epitaxial layer 3 is effectively thinned. Thus, the thickness of the n epitaxial layer 3 in the high breakdown voltage isolation region 16, after completion of the wafer process (shown in FIGS. 7(a) through 7(b), can be made thinner than a conventional device without affecting the low breakdown voltage element region 17.

The amount of boron implantation is adjusted to satisfy the conditions that, when the n− epitaxial layer 3 is ultimately formed as desired, and the wafer process is complete, there should be no rise in an impurity profile of the n− epitaxial layer 3 and the boron implanted layer 22 and the substrate 1 when viewed one-dimensionally. In this case, if there is too much difference of concentration in the n− epitaxial layer 3 and the P− substrate 1, a desired performance effect is not obtained. Therefore an impurity concentration in the n− epitaxial layer 3 is desired to be 10 fold or less than of that in the P− substrate 1.

With such a manufacturing process, it is possible to reduce floating of the n+ buried diffusion region 2 into the n− epitaxial layer 3 (i.e., to reduce sinking down of the n-epitaxial layer 3) and to provide the optimal conditions for both the low breakdown voltage element region 17 and the high breakdown voltage isolation region 16. In addition, the controlled thickness range can be widened for the n− epitaxial layer 3. Accordingly, it is possible to produce a high breakdown voltage isolation region capable of attaining a sufficiently high breakdown voltage isolation without impairing the characteristics of the low breakdown voltage element 18. Furthermore, with such a manufacturing process, the Inventors recognize low breakdown voltage element 18 having good characteristics and high breakdown voltage isolation regions having good characteristics can be manufactured using standard manufacturing processes for bipolar transistors and bipolar CMOS elements.

Ninth Embodiment

Figure 8:
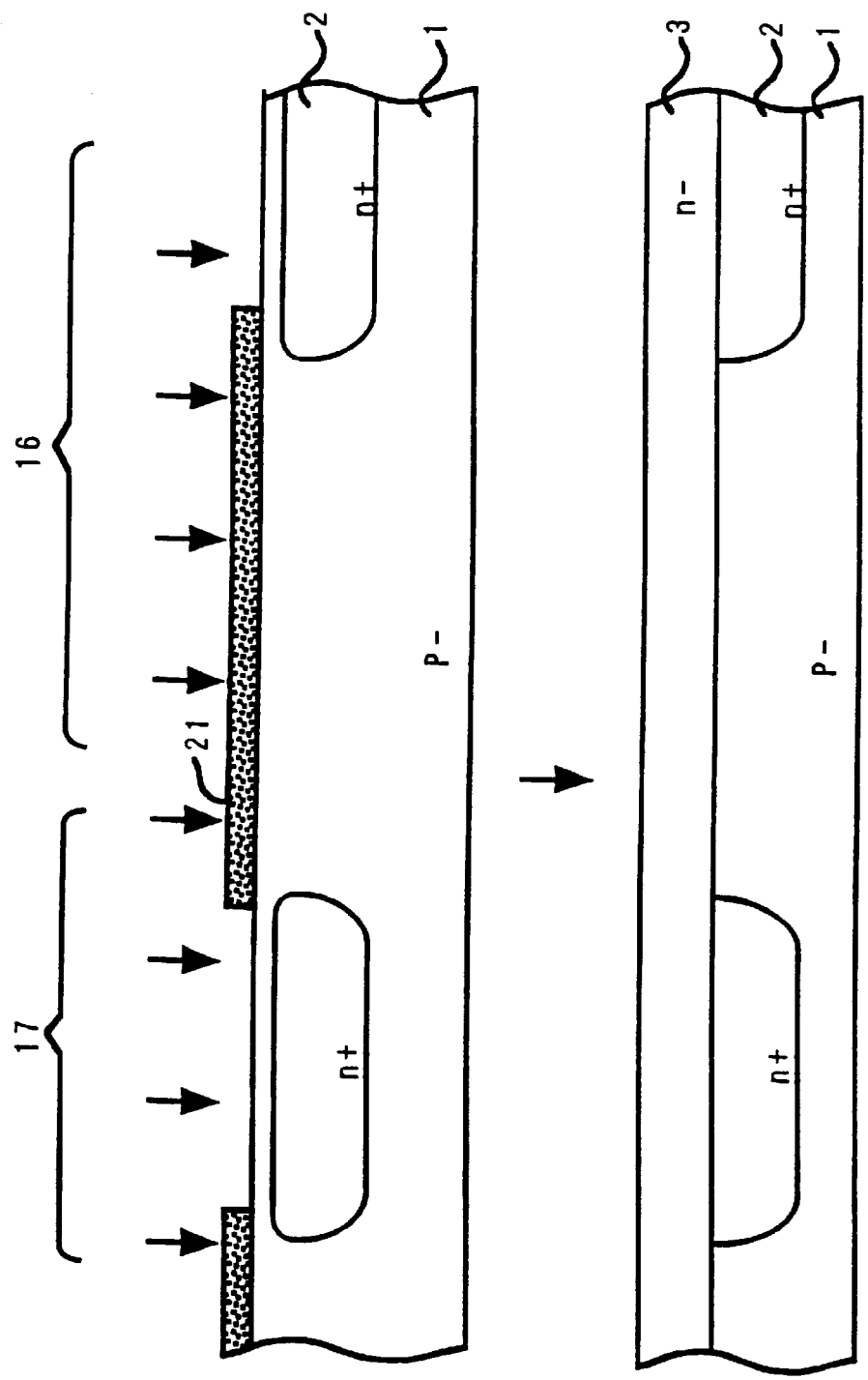
FIGS. 8(a) and 8(b) illustrate a manufacturing process of a semiconductor device according to a ninth embodiment of the present invention.

FIGS. 8(a) through 8(b) show another manufacturing process for manufacturing a semiconductor device having the structure shown in FIG. 5. Initially, as shown in FIG. 8(a), applied on the P− substrate 1 is a resist 21 with openings for forming the n+ buried diffusion regions 2. Then, n-type impurities such as antimony (Sb) are implanted through the openings under high energy to form the n+ buried diffusion regions 2 rather deeply from the primary surface of the P− substrate 1. Then, as shown in FIG. 8(b), the resist 21 is removed and an epitaxial layer 3 is grown. In this case, since the n+ buried diffusion region 2 is formed by high energy implantation, the resulting peak impurity concentration is located deep into the P− substrate 1, not at the primary surface. Furthermore, the n-type impurities are implanted with sufficient high energy such that when the n− epitaxial layer 3 is ultimately grown, the n+ buried diffusion region 2 is prevented from floating up into the n− epitaxial layer 3, and the thus n− epitaxial layer 3 is suppressed from sinking down into the P− substrate 1.

Accordingly, in the low breakdown voltage element region 17 the n+ buried diffusion region 2 is suppressed from floating up to the epitaxial layer 3 and there is no degrading effect on region 17 or element 18 since the n+ buried diffusion region 2 has a sufficiently high impurity concentration. On the other hand, in the high breakdown voltage isolation region 16, the antimony implantation does suppress a sinking down effect of the n− epitaxial layer 3 so that the thickness of the n− epitaxial layer 3 is effectively thinned. Thus, the thickness of the n− epitaxial layer 3 in the high breakdown voltage isolation region 16, after completion of the wafer process can be made thinner than a conventional device without affecting the low breakdown voltage element region 17.

With such an arrangement, the thickness of the epitaxial layer 3 can be determined without taking into account a floating up of the n+ buried diffusion region 2 into the n− epitaxial layer 3 so that a thickness of the epitaxial layer 3 in the high breakdown voltage isolation region 16 exhibits the Resurf effect. Therefore, it becomes possible to easily obtain a desired thickness of the epitaxial layer satisfying the characteristics of both the low breakdown voltage element 18 and the high breakdown voltage element in region 16.

With such a manufacturing process, it is possible to reduce floating of the n+ buried diffusion region 2 into the n− epitaxial layer 3 (i.e., to reduce sinking down of the n− epitaxial layer 3) and to provide the optimal conditions for both the low breakdown voltage element region 17 and the high breakdown voltage isolation region 16. In addition, the controlled thickness range can be widened for the n− epitaxial layer 3. Accordingly, it is possible to produce a high breakdown voltage isolation region capable of attaining a sufficiently high breakdown voltage isolation without impairing the characteristics of the low breakdown voltage element 18. Furthermore, with such a manufacturing process, the Inventors recognize low breakdown voltage elements 18 having good characteristics and high breakdown voltage isolation regions having good characteristics can be manufactured using standard manufacturing processes for bipolar transistors or bipolar CMOS elements.

Tenth Embodiment

Figure 9:
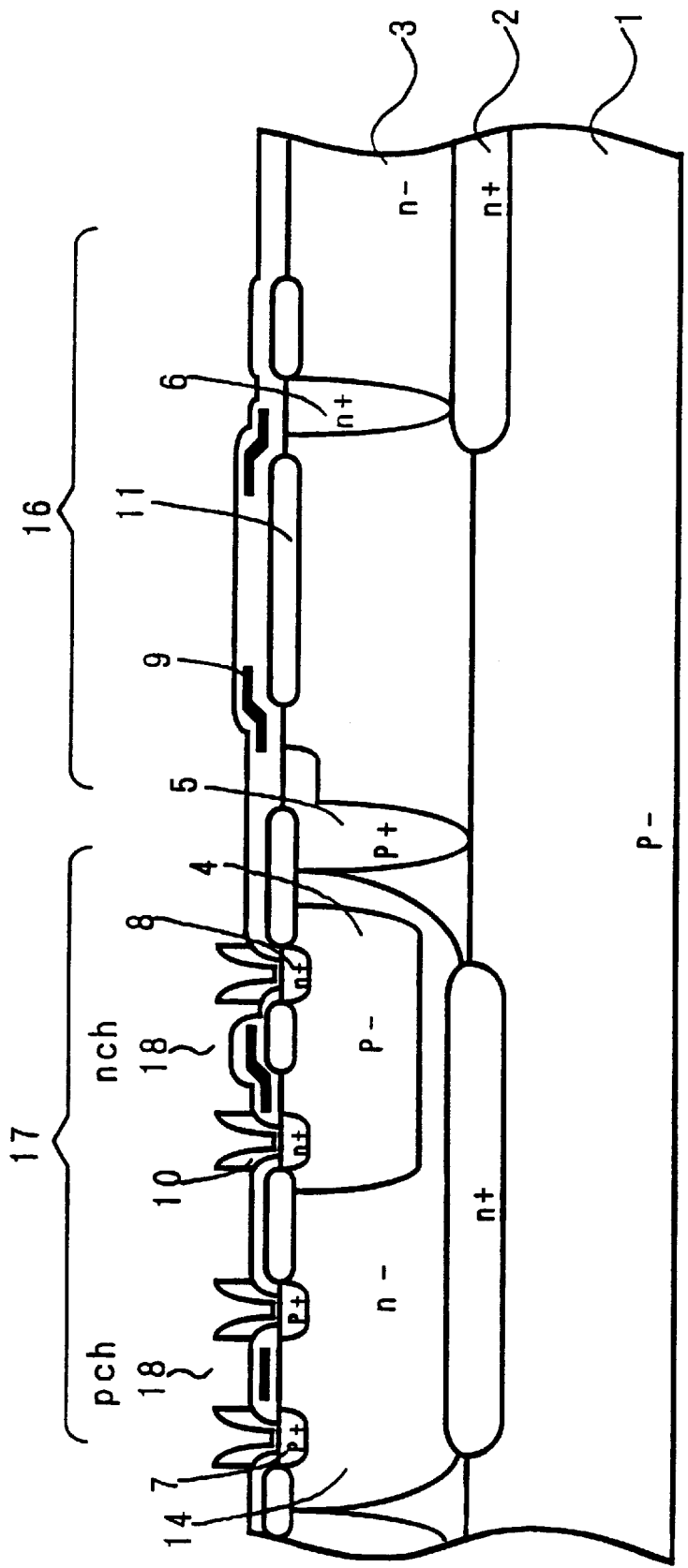
FIG. 9 shows a sectional view of a semiconductor device according to a tenth embodiment of the present invention.

FIG. 9 shows a semiconductor device according to the tenth embodiment of the present invention. As shown in FIG. 9, the semiconductor device of this embodiment comprises a P− substrate 1, an n+ buried diffusion region 2, an n− epitaxial layer 3, a P− diffusion region 4, a p+ diffusion region 5, an n+ diffusion region 6, a p+ diffusion region 7, an n+ diffusion region 8, a polysilicon electrode 9, an electrode 10, and a silicon oxide film 11. The n− epitaxial layer 3 has an impurity concentration higher than that of the P− substrate 1, and the P− diffusion region 4 has an impurity concentration higher than that of the n− epitaxial layer 3. In addition, the p+ diffusion region 5 is formed to reach the substrate 1. Further, the semiconductor device of FIG. 9 comprises an n− diffusion region 14.

The semiconductor device comprises a high breakdown voltage isolation region 16, and a low breakdown voltage element region 17. The high breakdown voltage isolation region 16 functions to isolate a high voltage from a high-voltage region (not shown in FIG. 9) continuing to the right of region 16 in FIG. 9. However, high breakdown voltage isolation elements sometimes may be integrally formed in the isolation region 16. Formed on a primary surface of the n− epitaxial layer 3 of the low breakdown voltage element region 17 is the n− diffusion region 14 in which a low breakdown voltage element 18 is formed. The low breakdown voltage element 18 includes CMOS and bipolar elements, while the high breakdown voltage element employs the Resurf technology. When the resurf technology is employed to obtain high breakdown voltage, the product of the thickness of the epitaxial layer 3 (unit: cm) and its impurity concentration (unit: $cm^{-3}$) must be $9.0 \times 10^{11}$ (unit: $cm^{-2}$) or less.

As discussed above, when the n− diffusion region 14 with a higher impurity concentration than the n− epitaxial layer 3 is formed on the n− epitaxial layer 3 of the low breakdown voltage element region 17, the concentration in both the low breakdown voltage element region 17 and the high voltage isolation region 16 can be adjusted, respectively, by increasing the concentration of the n− diffusion region 14 in the low breakdown voltage element region 17, but not to lower the threshold voltage of, for example, a p channel MOS as a low breakdown voltage element, and by reducing the impurity concentration in the n− epitaxial layer 3 in the high breakdown voltage isolation region 16 to satisfy the Resurf condition. Thus, the n− epitaxial layer 3 in the low breakdown voltage element region 17 may be effectively thickened with respect to a conventional device. In addition, the impurity concentration of the n− epitaxial layer 3 in the high breakdown voltage isolation region 16 may be set to a low level, consistent with the Resurf condition, so that the epitaxial layer 3 can satisfy the characteristics of both the high breakdown voltage element and the low breakdown voltage element 18.

With such a manufacturing process, it is possible to provide for optimal conditions for both the low breakdown voltage element region 17 and the high breakdown voltage isolation region 16 by varying the impurity concentration in the epitaxial layer 3 and in the n-diffused region 14 for these regions respectively. In addition, the controlled thickness range can be widened for the n− epitaxial layer 3. Accordingly, it is possible to produce a high breakdown voltage isolation region 16 capable of attaining sufficient breakdown voltage isolation without impairing the characteristics of the low breakdown voltage element 18. Furthermore, with such a manufacturing process, the Inventors recognize low breakdown voltage elements with good characteristics and high breakdown voltage isolation regions with good characteristics can be produced using standard manufacturing processes for bipolar transistors and bipolar CMOS elements.

Eleventh embodiment

Figure 10:
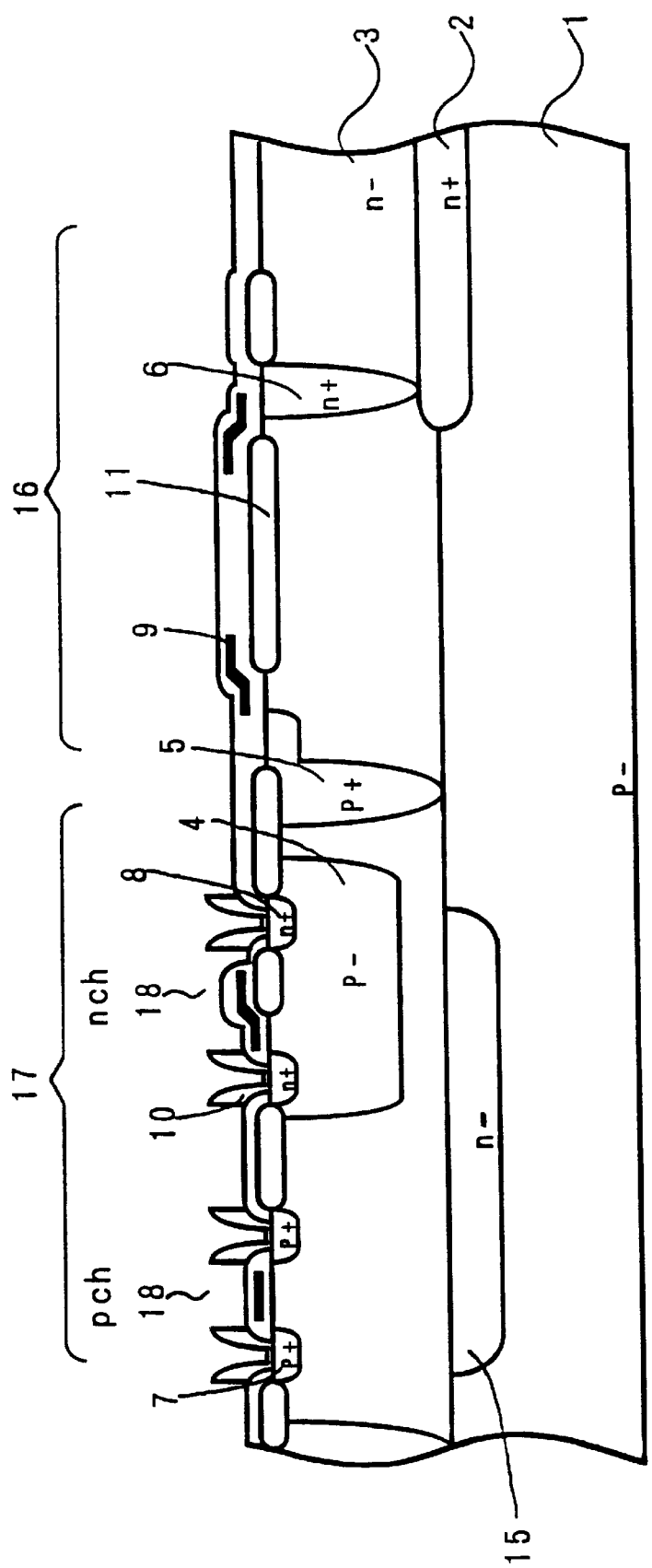
FIG. 10 shows a sectional view of a semiconductor device according to an eleventh embodiment of the present invention.

FIG. 10 shows a semiconductor device according to the eleventh embodiment of the present invention. As shown in FIG. 10, the semiconductor device of this embodiment comprises a P− substrate 1, an n+ buried diffusion region 2, an n− epitaxial layer 3, a P− diffusion region 4, a p+ diffusion region 5, an n+ diffusion region 6, a p+ diffusion region 7, an n+ diffusion region 8, a polysilicon electrode 9, an electrode 10, and a silicon oxide film 11. The n− epitaxial layer 3 has an impurity concentration higher than that of the P− substrate 1, and the P− diffusion region 4 has an impurity concentration higher than that of the n− epitaxial layer 3. In addition, the p+ diffusion region 5 is formed to reach the substrate 1. The above described elements correspond to those of FIG. 9, and are formed in a similar manner. In addition, the semiconductor device of FIG. 10 comprises an n− buried diffusion region 15 in the P− substrate 1 of a low breakdown voltage element region 17. The n− buried diffusion region 15 is configured to have a lower impurity concentration than the n+ buried diffusion region 2, and to float up, at most, marginally into the n− epitaxial layer 3.

The semiconductor device also comprises a high breakdown voltage isolation region 16, which functions to isolate a high voltage from a high-voltage region (not shown in FIG. 10, but would be to the right of region 16 in FIG. 10). However, high breakdown voltage isolation elements sometimes may be integrally formed in the region 16. A low breakdown voltage element 18 is formed in the low breakdown voltage element region 17. The low breakdown voltage element 18 includes CMOS and bipolar elements, while the high breakdown voltage element employs the Resurf technology.

Thus, when the buried diffusion region 15 is formed, "punch through" of an nch MOS transistor (e.g., an example of a low breakdown voltage element 18) can be prevented, although in a conventional semiconductor device punch through is a problem. In addition, the thickness of the epitaxial layer 3 can be determined without taking into account a floating up of the n− buried diffusion region 15 into the n− epitaxial layer 3. Furthermore, a sinking down of the n− epitaxial layer 3 is less in the high breakdown voltage isolation region 16 than with a conventional device so that the epitaxial layer 3 can have a thickness consistent with the Resurf condition.

With such a manufacturing process, it is possible to reduce floating up of the n+ buried diffusion region 2 into the n− epitaxial layer 3 (or to reduce sinking down of the n− epitaxial layer 3) and to provide the optimal conditions for both the low breakdown voltage element region 17 and the high breakdown voltage isolation region 16. In addition, the controlled thickness range can be widened for the n− epitaxial layer 3. Accordingly, it is possible to manufacture a high breakdown voltage isolation region capable of attaining a sufficiently high breakdown voltage isolation without impairing the characteristics of the low breakdown voltage element 18. Furthermore, with such manufacturing process, low breakdown voltage elements with good characteristics and high breakdown voltage isolation regions having good characteristics can be manufactured using standard manufacturing process for bipolar transistors or bipolar CMOS elements.

Suppose it is intended to provide another low breakdown voltage element region in a region continuing further outward (i.e. to the left, of the low breakdown voltage element region 17 shown in FIG. 10), and to form npn transistors therein. In general, npn transistors have a larger margin for the thickness of the epitaxial layer 3 than the n channel MOS transistors, although the characteristics of npn transistors are affected by resistance of the buried diffusion region. Therefore, the bipolar element region are preferably provided on the normal n+ buried diffusion region, while only MOS elements may be provided on the n− diffusion region 15.

Furthermore, in FIG. 10, the buried diffusion region 2 in the high breakdown voltage isolation region 16 may be formed simultaneously with the n− buried diffusion region 15 in the low breakdown voltage region 17, and in the same concentration. Additionally, a dual structure may be provided by forming the n+ buried diffusion region 2 in the n− buried diffusion region formed in the high breakdown voltage isolation region 16. This increases the breakdown voltage isolation for the high breakdown voltage isolation region 16.

Twelfth Embodiment

Figure 11:
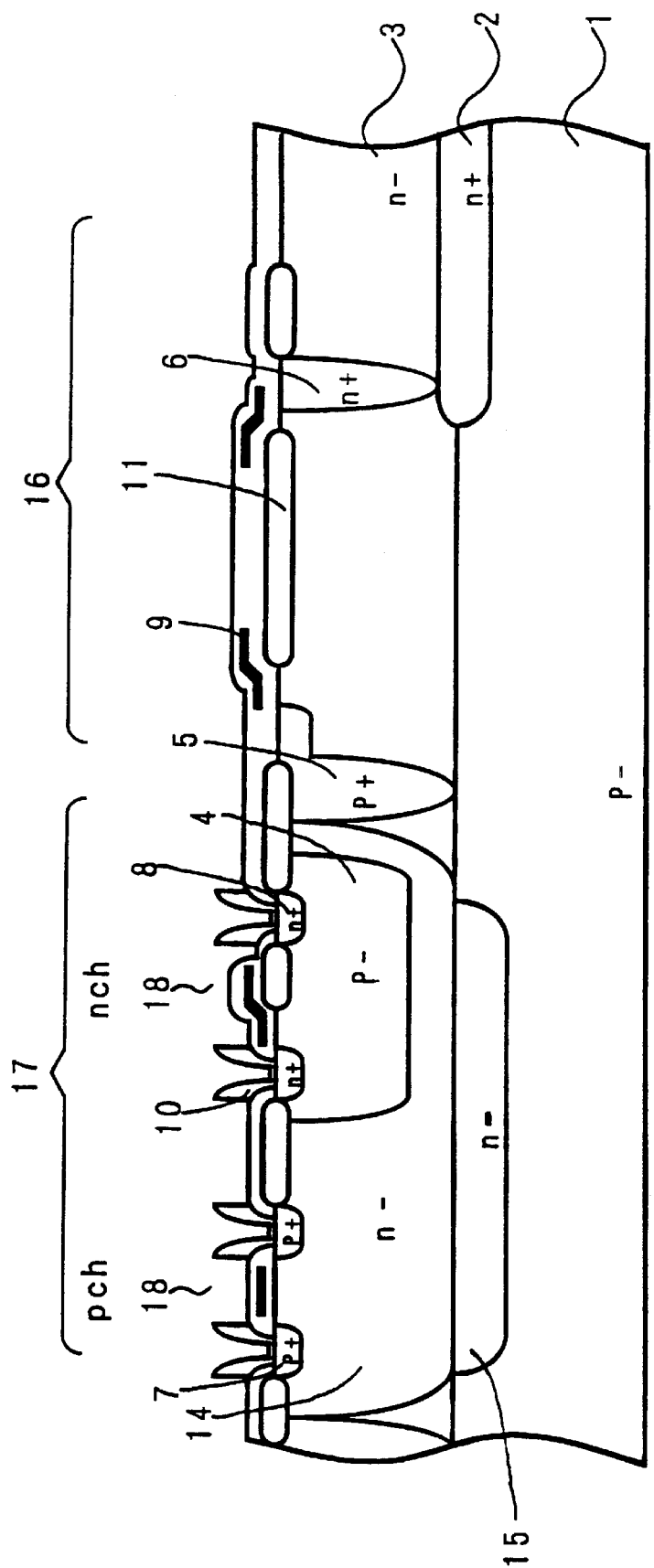
FIG. 11 shows a sectional view of a semiconductor device according to a twelfth embodiment of the present invention.

FIG. 11 shows a semiconductor device according to the twelfth embodiment of the present invention. The semiconductor device of this embodiment combines aspects of the tenth and eleventh embodiments. As shown in FIG. 11, the semiconductor device comprises a P− semiconductor substrate 1, an n+ buried diffusion region 2, an n− epitaxial layer 3, a P− diffusion region 4, a p+ diffusion region 5, an n+ diffusion region 6, a p+ diffusion region 7, an n+ diffusion region 8, a polysilicon electrode 9, an electrode 10, and a silicon oxide film 11. The n− epitaxial layer 3 has an impurity concentration higher than that of the P− substrate 1, and the P− diffusion region 4 has an impurity concentration higher than that of the n− epitaxial layer 3. In addition, the p+ diffusion region 5 is formed to reach the substrate 1. The above described elements correspond to those of FIG. 9, and are formed in a similar manner. In addition, the semiconductor device of FIG. 11 comprises an n− diffusion region 14 a primary surface of the n− epitaxial layer 3 in the low breakdown voltage region 17, and an n− buried diffusion region 15 in the P− substrate 1 of the low breakdown voltage element region 17. The n− buried diffusion region 15 is designed to have a lower impurity concentration than the n+ buried diffusion region 2, and to, at most, float up marginally into the n− epitaxial layer 3.

The semiconductor device also comprises a high breakdown voltage isolation region 16 which functions to isolate a high voltage from a high voltage region (not shown in FIG. 11, but would be continuing to the right of region 16 in FIG. 11). However, high breakdown voltage isolation elements sometimes may be integrally formed on the isolation region 16. A low breakdown voltage element 18 is formed in the low breakdown voltage element region 17. The low breakdown voltage element 18 includes CMOS and bipolar elements, while the high breakdown voltage element employs the Resurf technology.

As discussed above, when the n− diffusion region 14 with a higher impurity concentration than the n− epitaxial layer 3 is formed on the n− epitaxial layer 3 of the low breakdown voltage element region 17, the concentration in both the low breakdown voltage element region 17 and the high voltage isolation region 16 can be adjusted respectively, by increasing the concentration of the n− diffusion region 14 in the low breakdown voltage element region 17, and by reducing the concentration in the n− epitaxial layer 3 in the high breakdown voltage isolation region 16. Thus, the n− epitaxial layer 3 in the low breakdown voltage element region 17 may be substantially thickened with respect to a conventional device. In addition, the impurity concentration of the n− epitaxial layer 3 in the high breakdown voltage isolation region 16 may be set to a low level, consistent with the Resurf condition, so that the epitaxial layer 3 can satisfy the characteristics of both the high breakdown voltage element and the low breakdown voltage element 18.

In addition, the n− buried diffusion region 15 is configured to have a lower impurity concentration than the n+ buried diffusion region 2, and to, at most, float up marginally into the n− epitaxial layer 3. Thus, when the buried diffusion region 15 is formed "punch through" of, for example, an n channel MOS transistor (e.g., an example of a low breakdown voltage element 18), can be prevented, although in a conventional semiconductor device punch through is a problem. Furthermore, a sinking down of the n− epitaxial layer 3 is less in the high breakdown voltage isolation region 16 than with so that the epitaxial layer 3 can have a thickness consistent with the Resurf condition. Thus, the twelfth embodiment combines features from the tenth and eleventh embodiments, so that the controlled thickness range can be widened for the n− epitaxial layer 3 to satisfy the characteristics of both the low breakdown voltage element 18 and the high breakdown voltage element.

With such a manufacturing process, it is possible to provide optimal conditions for both the low breakdown voltage element region 17 and the high breakdown voltage isolation region 16 by varying the impurity concentration of the epitaxial layer 3 and of the n– diffusion region 14 respectively. In addition, the controlled thickness range can be widened for the n– epitaxial layer 3. Accordingly, it is possible to produce a high breakdown voltage isolation region capable of attaining a sufficiently high breakdown voltage isolation without impairing the characteristics of the low breakdown voltage element 18. Furthermore, with such a manufacturing process, the Inventors recognize low breakdown voltage elements with good characteristics and high breakdown voltage isolation regions having good characteristics can be produced using standard manufacturing process of bipolar transistors or bipolar CMOS elements.

Obviously, numerous additional modifications and variations of the present invention are possible in the light of the above teachings. It is therefore to be understood that within the scope of the appended claims the invention may be practiced otherwise than as specifically described herein.

What is claimed as new and desired to be secured by letters patent of the United States is:

1. A process for manufacturing a semiconductor device comprising the steps of:
    forming a buried diffusion region of a second conductivity type on a first part of a primary surface of a semiconductor substrate of a first conductivity type; and
    forming an epitaxial layer of the second conductivity type in contact with said primary surface of said semiconductor substrate and said buried diffusion region, said forming an epitaxial layer step comprising:
        forming in compliance with a Resurf condition a high breakdown voltage isolation region in a first part of said epitaxial layer, and
        forming a low breakdown voltage element region in a second part of the epitaxial layer without impairing the breakdown voltage characteristic of an element formed in the low break down voltage region.

2. The process of claim 1, wherein said forming in compliance step comprises:
    forming said high breakdown voltage isolation region such that a multiplicative product of a thickness and an impurity concentration of said high breakdown voltage isolation region is at most $9.0 \times 10^{11}$ impurity elements/$cm^2$.

3. The process of claim 1, further comprising the steps of:
    forming selectively an oxide film on a primary surface of said epitaxial layer; and
    removing said oxide film, and wherein
    said forming in compliance step comprises forming the high breakdown voltage isolation region where said oxide film was removed.

4. The process of claim 1, further comprising the step of:
    etching selectively a primary surface of said epitaxial layer; and
    wherein said forming in compliance step comprises forming said high breakdown voltage isolation region where said epitaxial layer was selectively etched.

5. The process of claim 3, further comprising the step of:
    etching selectively the primary surface of the epitaxial layer prior to said forming selectively step.

6. The process of claim 1 wherein said forming an epitaxial layer step comprises:
    forming a non-doped epitaxial layer in contact with said primary surface of said semiconductor substrate and said buried diffusion region; and
    forming an epitaxial layer of the second conductivity type in contact with said non-doped epitaxial layer.

7. The process of claim 1, further comprising the step of:
    implanting impurities of the first conductivity type into a primary surface of the buried diffusion region and the primary surface of the substrate.

8. The process of claim 1 wherein said step of forming a buried diffusion region comprises:
    forming said buried diffusion region by implanting impurities of the second conductivity type into the first part of the primary surface of the substrate.

9. The process of claim 1, further comprising the steps of:
    forming an impurity diffusion region of the second conductivity type on the primary surface of said epitaxial layer continuing from said buried diffusion region; and
    forming a low breakdown voltage element on the primary surface of said impurity diffusion region.

10. A process for manufacturing a semiconductor device, comprising the steps of:
    forming a first buried diffusion region of a second conductivity type on a first part of a primary surface of a semiconductor substrate of a first conductivity type;
    forming a second buried diffusion region of the second conductivity type having an impurity concentration lower than an impurity concentration of the first buried diffusion region on a second part of the primary surface of the semiconductor substrate; and
    forming an epitaxial layer of the second conductivity type in contact with said semiconductor substrate, said first buried diffusion region, and said second buried diffusion region, said forming an epitaxial layer step comprising:
        forming in compliance with a Resurf condition a high breakdown voltage isolation region in a first part of said epitaxial layer which contacts the substrate and the first buried diffusion region, and
        forming a low breakdown voltage element region in a second part of the epitaxial layer which contacts said second buried diffusion region and is formed without impairing the breakdown voltage characteristic of an element formed in the low break down voltage region.

11. The process of claim 10, further comprising the step of:
    forming an impurity diffusion region of the second conductivity type on a primary surface of the epitaxial layer that contacts said second buried diffusion region.

12. The process of claim 10, wherein said forming in compliance step comprises:
    forming said high breakdown voltage isolation region such that a multiplicative product of a thickness and an impurity concentration of said high breakdown voltage isolation region is at most $9.0 \times 10^{11}$ impurity elements/$cm^2$.

* * * * *